(12) United States Patent
Kim et al.

(10) Patent No.: US 10,411,194 B2
(45) Date of Patent: Sep. 10, 2019

(54) ORGANIC LIGHT EMITTING DISPLAY DEVICE

(71) Applicant: LG DISPLAY CO., LTD., Seoul (KR)

(72) Inventors: Shinhan Kim, Seoul (KR); Dohan Kim, Gyeonggi-do (KR); Min Yun, Gyeonggi-do (KR); Seunghee Yoon, Seoul (KR)

(73) Assignee: LG Display Co., Ltd., Seoul (KR)

( * ) Notice: Subject to any disclaimer, the term of this patent is extended or adjusted under 35 U.S.C. 154(b) by 374 days.

(21) Appl. No.: 15/133,456

(22) Filed: Apr. 20, 2016

(65) Prior Publication Data

US 2017/0092870 A1 Mar. 30, 2017

(30) Foreign Application Priority Data

Sep. 24, 2015 (KR) .................. 10-2015-0135628

(51) Int. Cl.
*H01L 51/00* (2006.01)
*H01L 51/50* (2006.01)
*H01L 51/52* (2006.01)

(52) U.S. Cl.
CPC ...... *H01L 51/0067* (2013.01); *H01L 51/0052* (2013.01); *H01L 51/5004* (2013.01); *H01L 51/5016* (2013.01); *H01L 51/5076* (2013.01); *H01L 51/5088* (2013.01); *H01L 51/5206* (2013.01); *H01L 51/5221* (2013.01); *H01L 51/5278* (2013.01); *H01L 2251/552* (2013.01); *H01L 2251/558* (2013.01)

(58) Field of Classification Search
CPC ............. H01L 51/0067; H01L 51/0051; H01L 51/5004; H01L 51/5008
See application file for complete search history.

(56) References Cited

U.S. PATENT DOCUMENTS

| | | | | |
|---|---|---|---|---|
| 2012/0104941 | A1* | 5/2012 | Jung | C07D 239/26 313/504 |
| 2012/0280214 | A1* | 11/2012 | Makino | H01L 51/5092 257/40 |
| 2013/0264561 | A1* | 10/2013 | Dobbs | C09K 11/06 257/40 |
| 2014/0117337 | A1* | 5/2014 | Jung | H01L 51/5044 257/40 |

(Continued)

FOREIGN PATENT DOCUMENTS

WO WO-2013180503 A1 * 12/2013 ......... H01L 51/5076

OTHER PUBLICATIONS

STIC search. (Year: 2018).*
SciFinder search. (Year: 2018).*

*Primary Examiner* — Devina Pillay
*Assistant Examiner* — Daniel P Malley, Jr.
(74) *Attorney, Agent, or Firm* — Morgan, Lewis & Bockius LLP

(57) ABSTRACT

An organic light emitting display device is provided. The organic light emitting display device includes at least two or more light emitting parts between an anode and a cathode and each having a light emitting layer. At least one of the at least two or more light emitting parts includes an organic layer. The organic layer is formed of a compound comprising a functional group that reacts with alkali metals or alkali earth metals and a functional group with electron transport properties.

9 Claims, 5 Drawing Sheets

(56) References Cited

U.S. PATENT DOCUMENTS

2014/0306207 A1* 10/2014 Nishimura ........... C07D 401/14
  257/40
2015/0144897 A1* 5/2015 Kang ................. H01L 51/5076
  257/40

* cited by examiner

ORGANIC LIGHT EMITTING DISPLAY DEVICE

This application claims the priority benefit of Korean Patent Application No. 10-2015-0135628 filed on Sep. 24, 2015, which is hereby incorporated herein by reference for all purposes as if fully set forth herein.

BACKGROUND

Field

The present disclosure relates to an organic light emitting display device, and more particularly, to an organic light emitting display device reduced manufacturing costs, improved efficiency, and increased lifetime.

Discussion of the Related Art

Image displays used for displaying a variety of information on the screen are one of the core technologies of the information and communication era. Such image displays have been developed to be thinner, lighter, and more portable, and furthermore to have high performance. With the development of the information society, various demands for display devices are on the rise. To meet these demands, research on panel displays such as liquid crystal displays (LCD), plasma display panels (PDP), electroluminescent displays (ELD), field emission displays (FED), organic light emitting diodes (OLED), etc is actively under way.

Among these types of panel displays, the OLED devices are a type of devices that emit light as electrons and holes are paired and then extinguished, when a charge is injected into an organic light emitting layer between an anode and a cathode. The OLED devices are advantageous in that they can be formed on a flexible transparent substrate such as plastic, can be driven at relatively low voltage, less power consumption, and excellent color sensitivity, as compared to plasma display panels or inorganic EL displays. Especially, white OLED devices are used for various purposes in lighting, thin light sources, backlights for liquid crystal displays, or full-color displays employing color filters.

In the development of white OLED devices, high efficiency, long lifetime, color purity, color stability against current and voltage variations, ease of manufacture, etc are important, so research and development are being done depending on which of these features should be taken into account. White OLED device structures may be roughly classified into a single-layer emitting structure and a multi-layer emitting structure. Of these structures, the multilayer emitting structure having a blue fluorescent emitting layer and a yellow phosphorescent emitting layer stacked in tandem is mainly employed to realize white OLED devices with long lifetime.

Specifically, a stack structure of first and second light emitting parts is used, with the first light emitting part using a blue fluorescent diode as a light emitting layer, and the second light emitting part using a yellow-green phosphorescent diode as a light emitting layer. Such a white OLED device produces white light by mixing blue light emitted from the blue fluorescent diode and yellow-green light emitted from the yellow-green phosphorescent diode. A charge generation layer is between the first light emitting part and the second light emitting part to double the current efficiency generated in the light emitting layers and facilitate charge distribution. The charge generation layer is a layer that generates a charge, i.e., electrons and holes, in it, and comprises an N-type charge generation layer and a P-type charge generation layer.

By the way, the white OLED device comprises numerous functional layers such as a hole injection layer, a hole transport layer, an electron transport layer, and an electron injection layer, in addition to the above-mentioned charge generation layer. Since the functional layers have different material characteristics, a deposition chamber setup is required for each material prior to the process, which results in a process loss. Also, the manufacturing costs are expensive due to the high costs of the materials of the functional layers. Therefore, there is a need to simplify the manufacturing process of organic light emitting display devices and reduce the manufacturing costs.

SUMMARY

Accordingly, the present invention is directed to an organic light emitting display device that substantially obviates one or more of the problems due to limitations and disadvantages of the related art An object of the present invention is to provide an organic light emitting display device with reduced manufacturing costs, improved efficiency, and increased lifetime.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the disclosure, as embodied and broadly described, an organic light emitting display device comprises at least two or more light emitting parts between an anode and a cathode and each comprising a light emitting layer, at least one of the at least two or more light emitting parts comprising an organic layer, wherein the organic layer is formed of a compound comprising a functional group that reacts with alkali metals or alkali earth metals and a functional group with electron transport properties.

At least one of the at least two or more light emitting parts comprises a phosphorescent light emitting layer.

One of the at least two or more light emitting parts is a blue light emitting part, and the another one of the at least two or more light emitting parts is a yellow-green light emitting part.

The organic layer is included in the yellow-green light emitting part.

The organic layer further comprises an alkali metal or alkali earth metal.

The organic layer comprises an electron transport part comprising the compound and a charge generation part comprising alkali metals or alkali earth metals and the compound.

The alkali metals or alkali earth metals in the charge generation part is uniformly mixed or has a concentration gradient.

The total thickness of the organic layer is 300 to 500 Å, and the thickness of the electron transport part is 150 to 250 Å.

The electron transport part includes the functional group with electron transport properties and the charge generation part includes the functional group that reacts with the alkali metals or the alkali earth metals.

The organic layer has a HOMO level ranging from −5.5 to −6.5 eV and a LUMO level ranging from −2.5 to −3.5 eV.

The organic light emitting display device, further comprising a P-type charge generation layer between the at least two or more light emitting parts, wherein the organic layer adjoins the P-type charge generation layer.

The compound is represented by the following Chemical Formula 1:

[Chemical Formula 1]

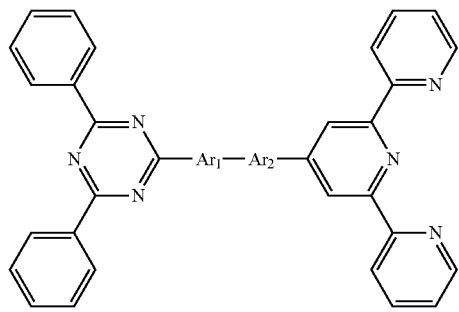

wherein $Ar_1$ and $Ar_2$ are independently a substituted or unsubstituted aromatic or heteroaromatic compound of 6 to 12 carbon atoms that has a molecular weight of 70 to 150.

The compound represented by Chemical Formula 1 includes one of the following compounds represented by Chemical Formulae 2 to 5:

[Chemical Formula 2]

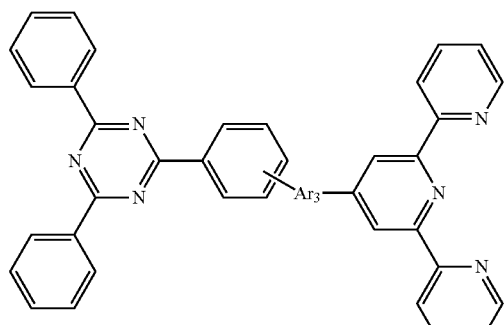

[Chemical Formula 3]

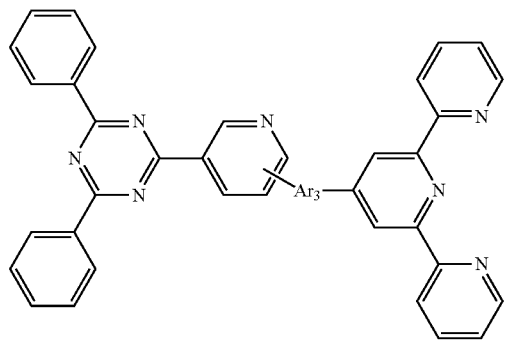

[Chemical Formula 4]

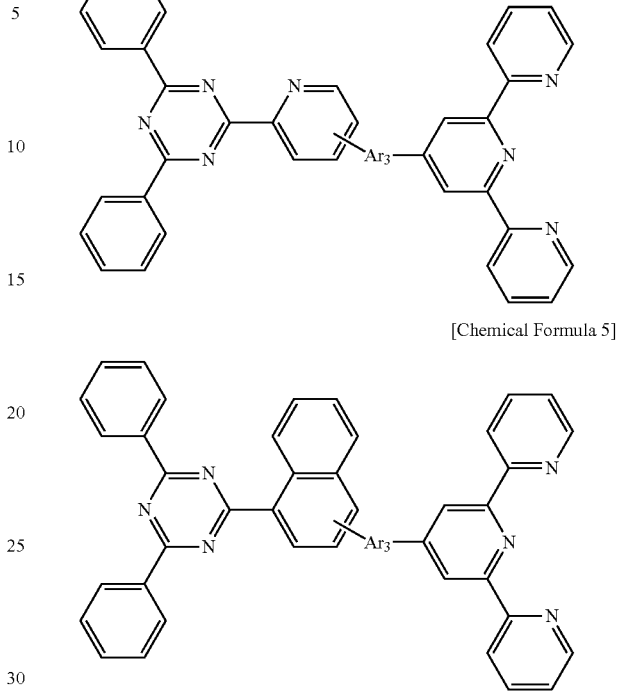

[Chemical Formula 5]

wherein $Ar_3$ includes a substituted or unsubstituted aromatic or heteroaromatic compound of 6 to 12 carbon atoms that has a molecular weight of 70 to 150.

The compound represented by Chemical Formula 1 includes one of the following compounds:

1-1

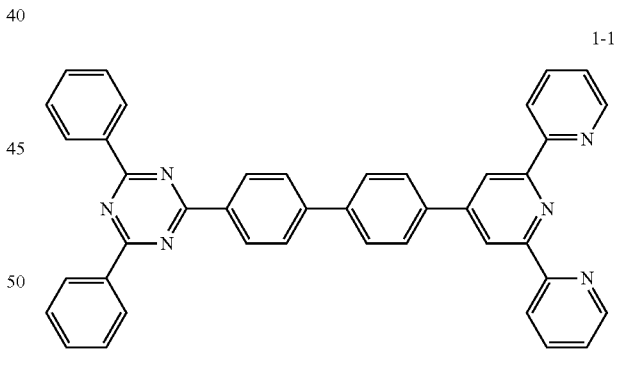

1-2

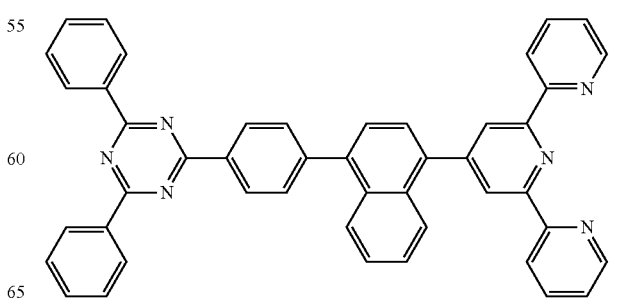

1-3
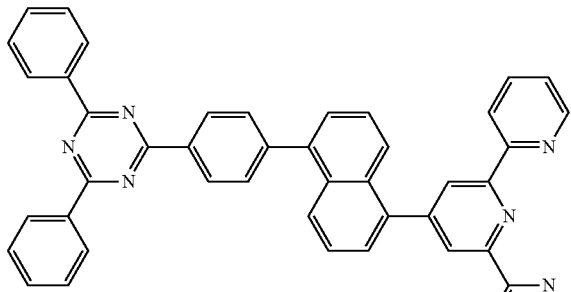
1-4
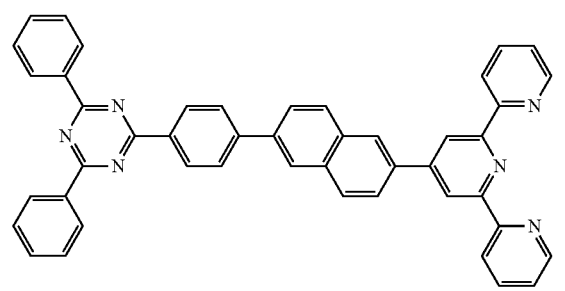
1-5
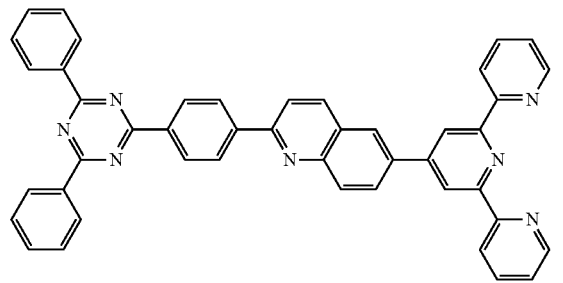
1-6
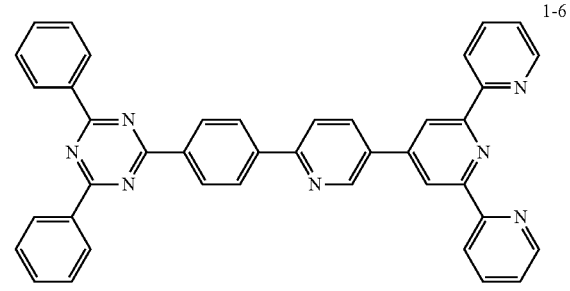
1-7
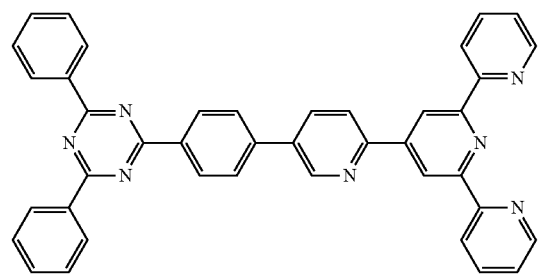
1-8
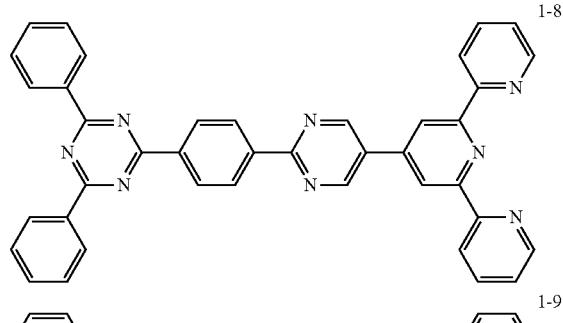
1-9
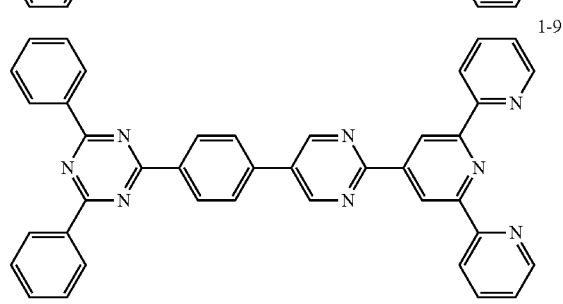
2-1
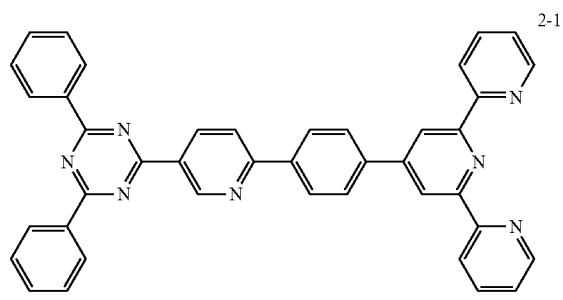
2-2
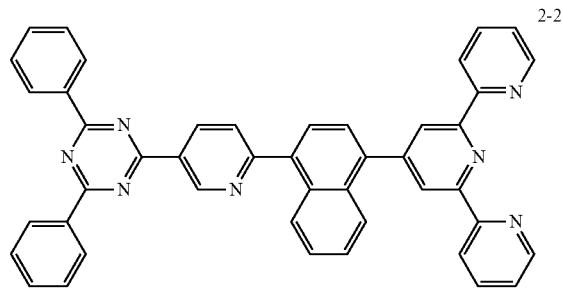
2-3
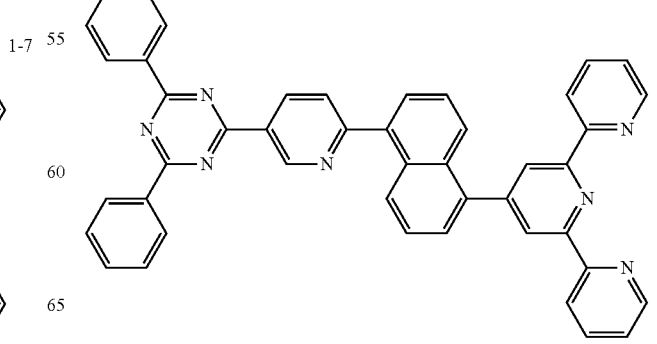

2-4
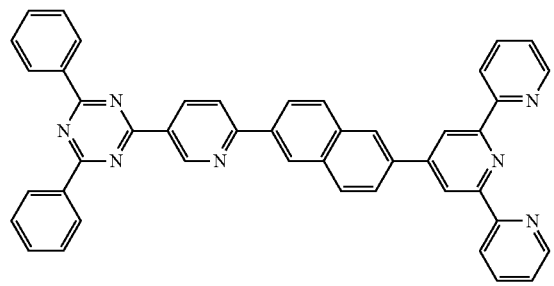
2-5
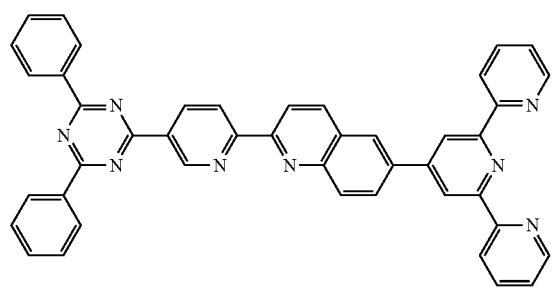
2-6
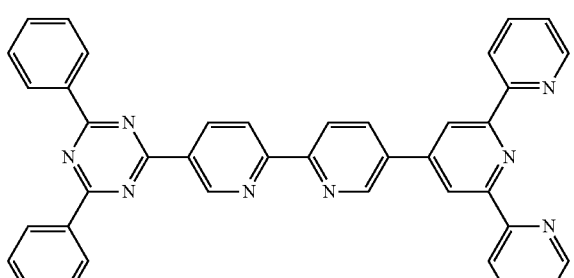
2-7
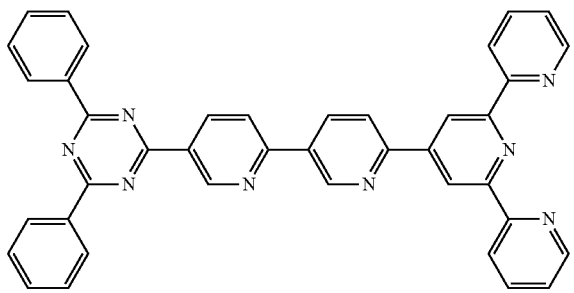
2-8
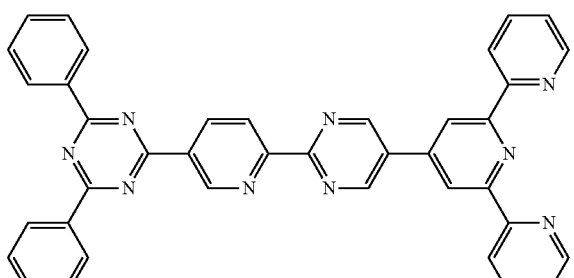
2-9
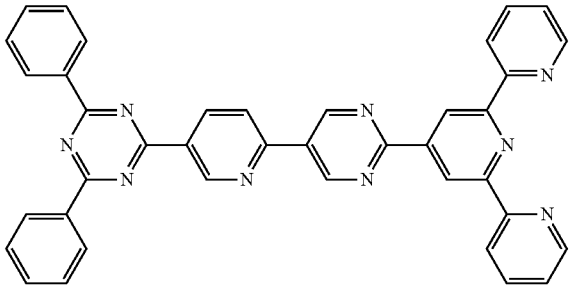
3-1
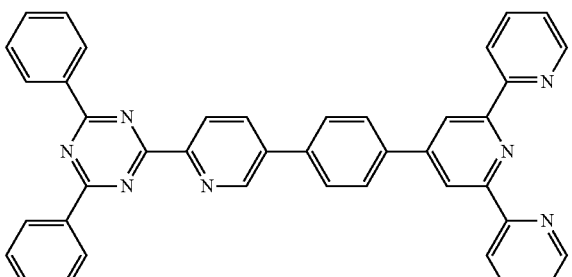
3-2
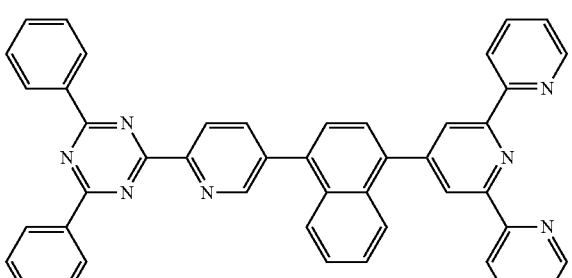
3-3
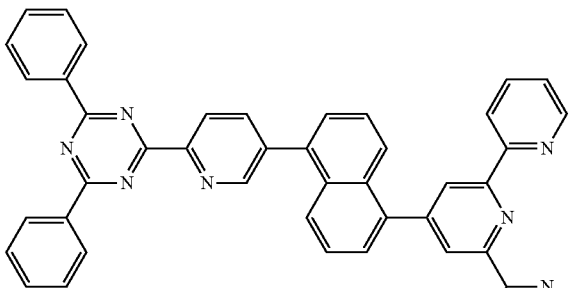
3-4
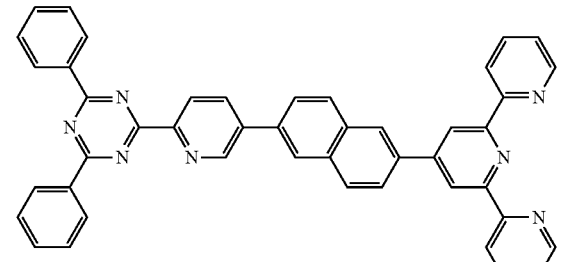

3-5
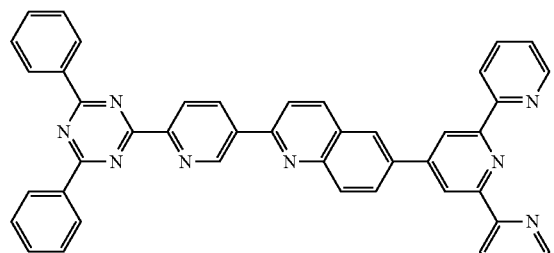
3-6
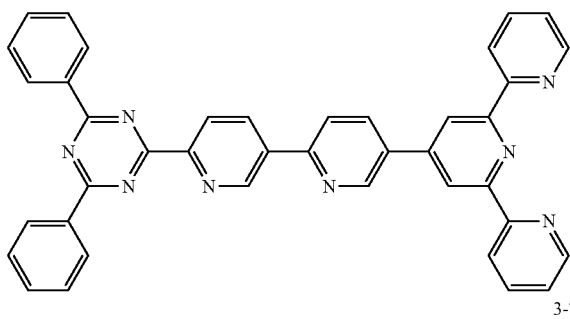
3-7
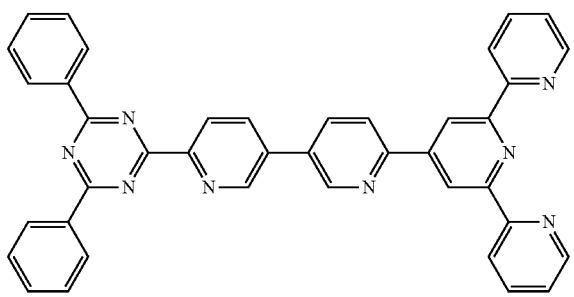
3-8
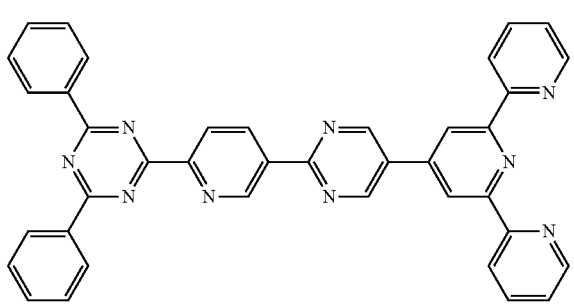
3-9
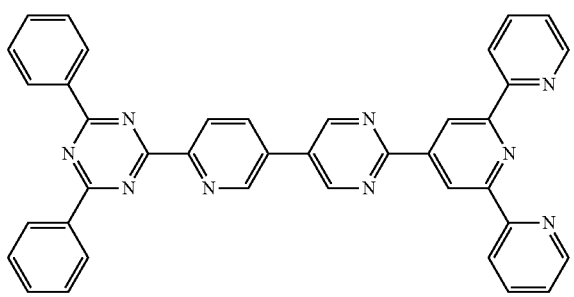
4-1
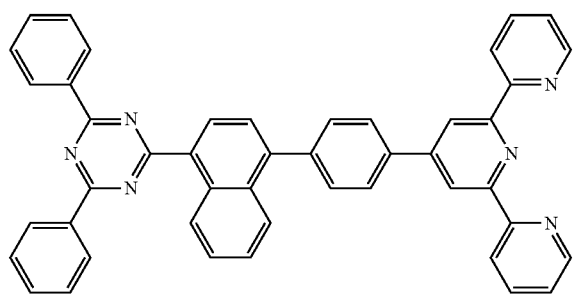
4-2
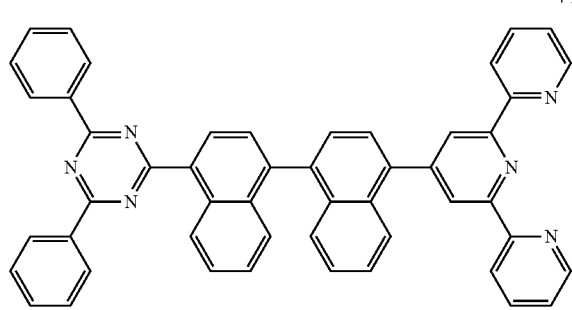
4-3
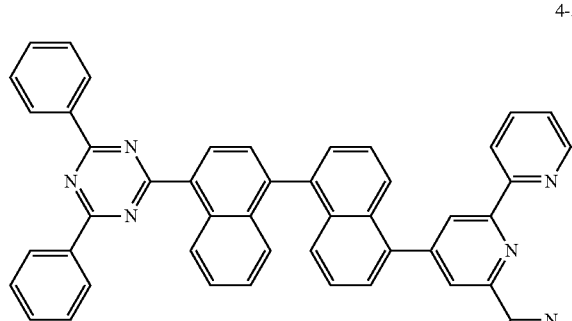
4-4
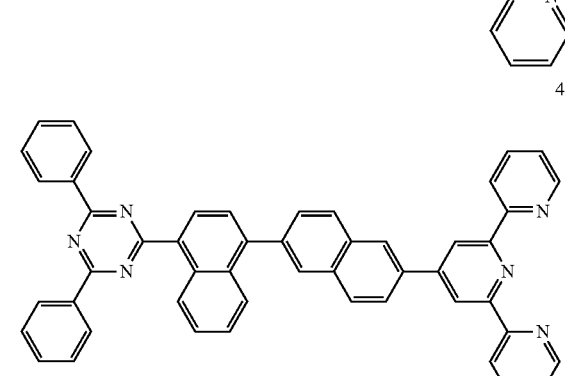
4-5
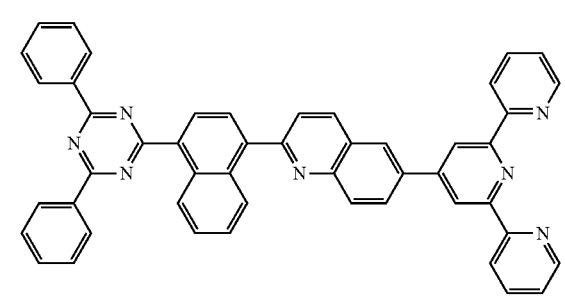

4-6
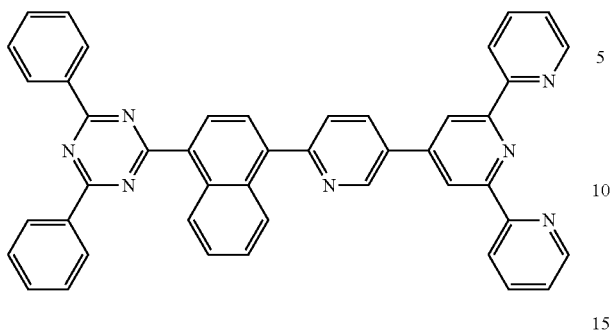

4-7
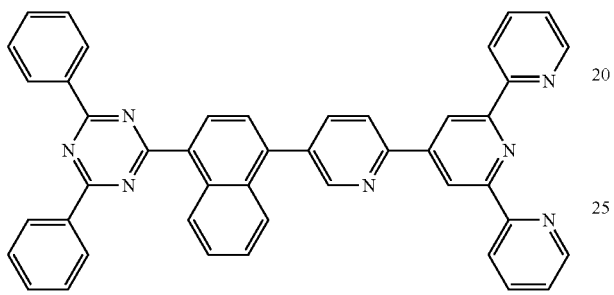

4-8
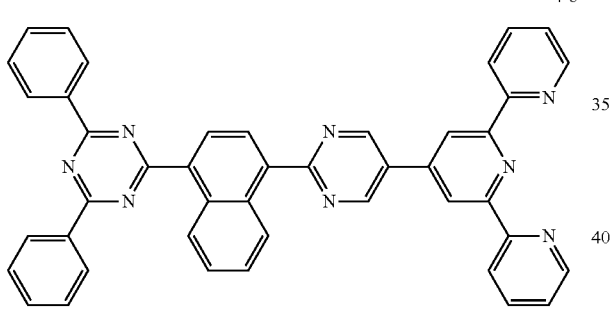

4-9
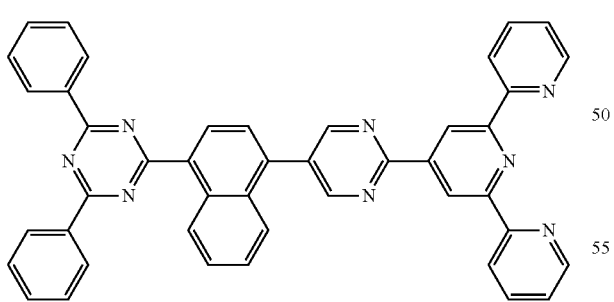

In another aspect, an organic light emitting display device comprises at least two or more light emitting parts between an anode and a cathode and each comprising a light emitting layer, at least one of the at least two or more light emitting parts comprising an organic layer, wherein the organic layer is represented by the following Chemical Formula 1:

[Chemical Formula 1]
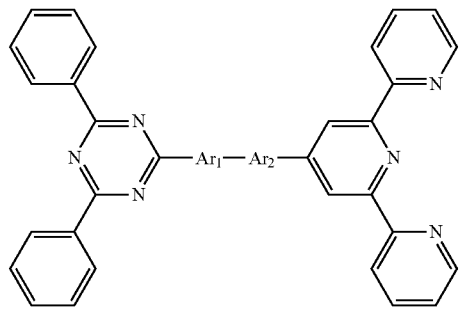

wherein $Ar_1$ and $Ar_2$ are independently a substituted or unsubstituted aromatic or heteroaromatic compound of 6 to 12 carbon atoms that has a molecular weight of 70 to 150.

The compound represented by Chemical Formula 1 includes one of the following compounds represented by Chemical Formulae 2 to 5:

[Chemical Formula 2]
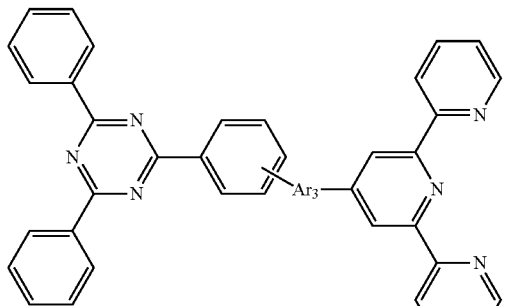

[Chemical Formula 3]
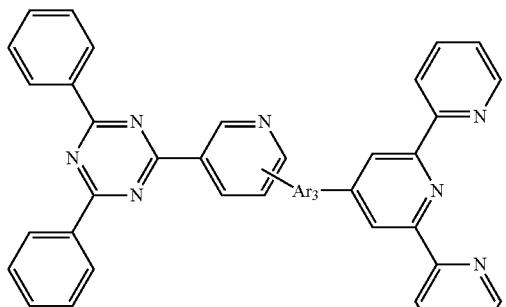

[Chemical Formula 4]
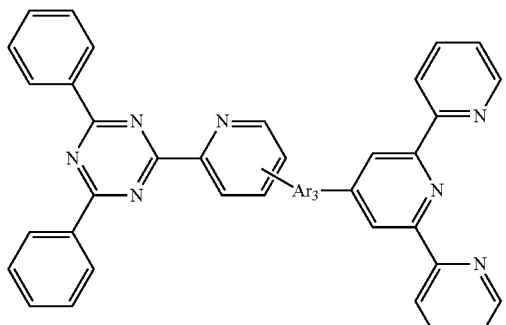

[Chemical Formula 5]
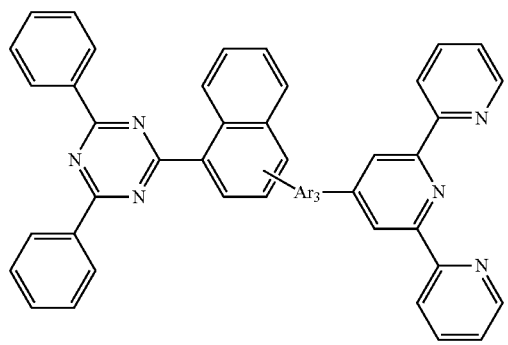
wherein Ar₃ includes a substituted or unsubstituted aromatic or heteroaromatic compound of 6 to 12 carbon atoms that has a molecular weight of 70 to 150.
The compound represented by Chemical Formula 1 includes one of the following compounds:
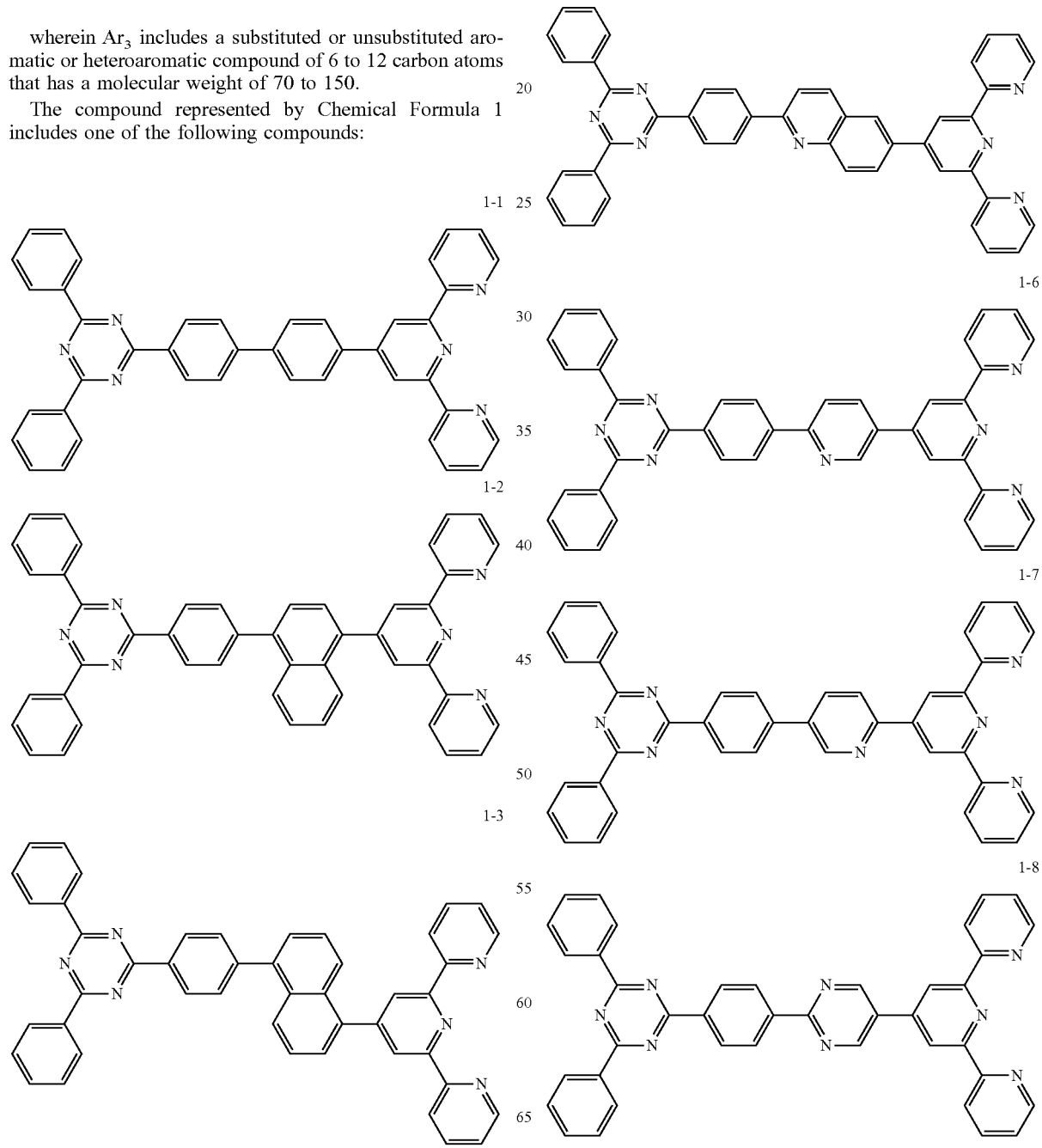
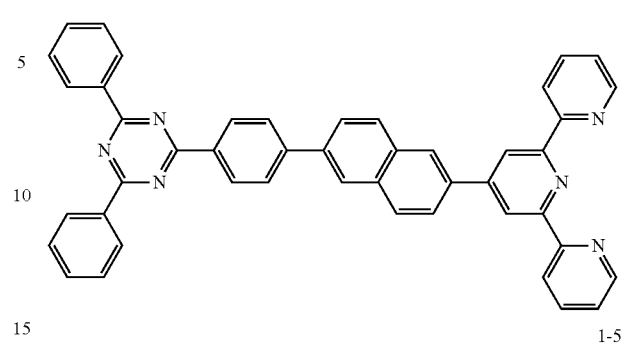

1-9
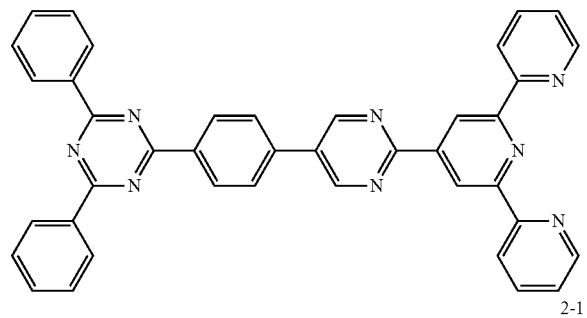
2-1
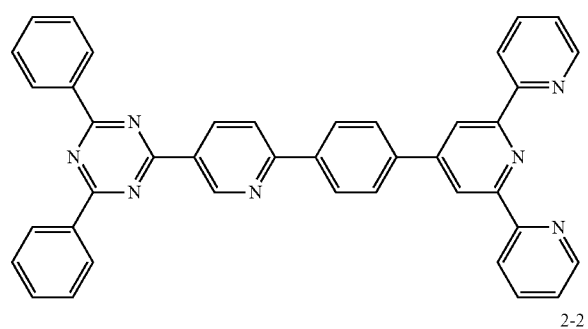
2-2
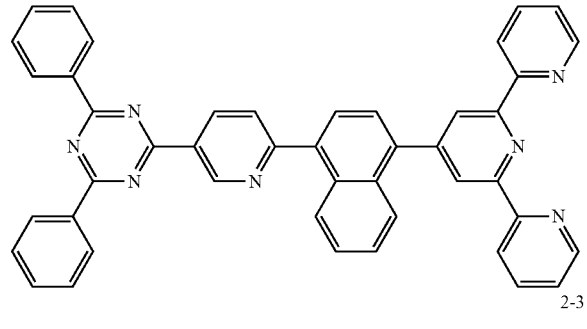
2-3
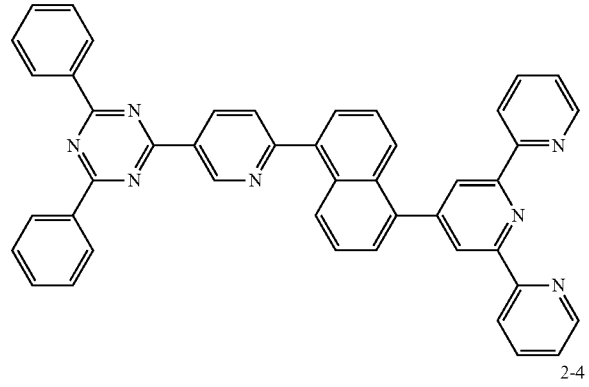
2-4
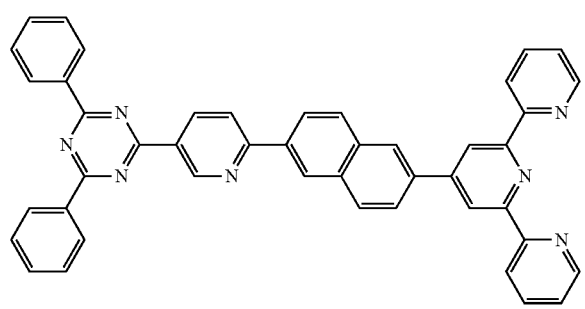
2-5
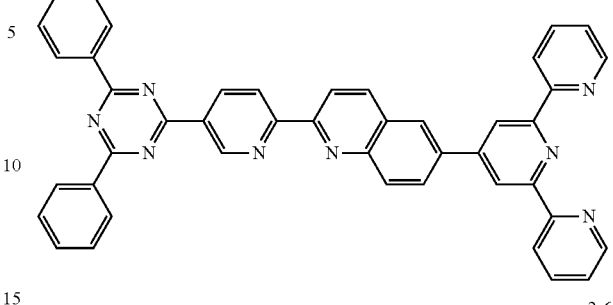
2-6
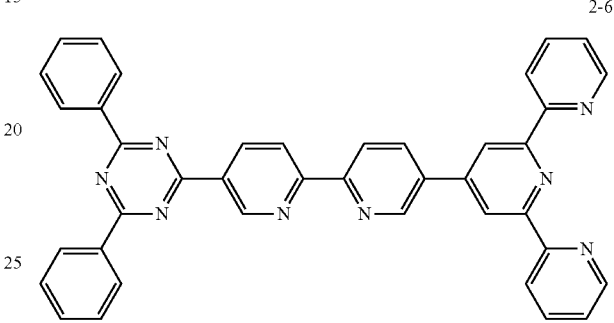
2-7
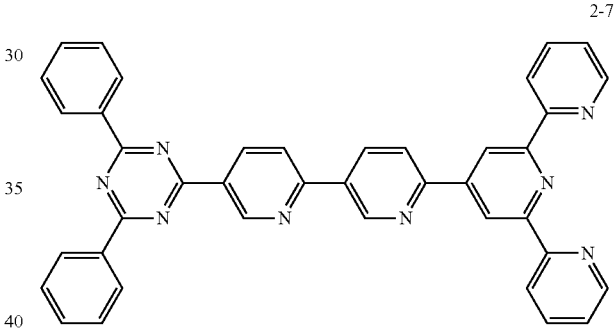
2-8
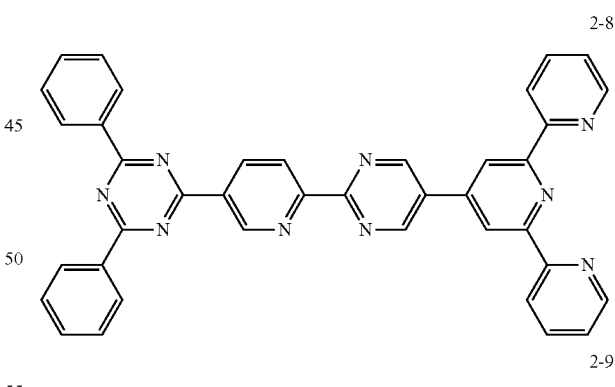
2-9
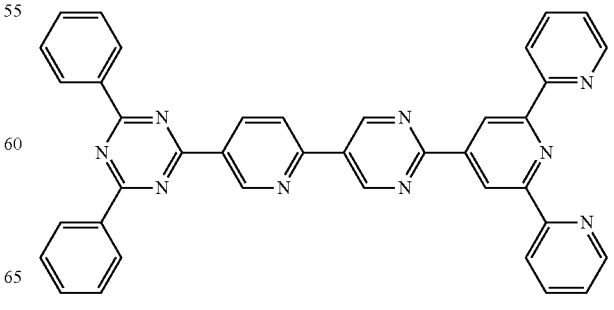

3-1
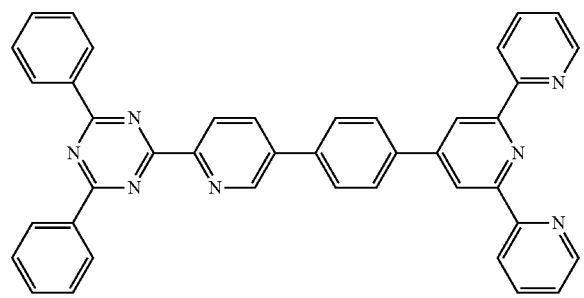
3-2
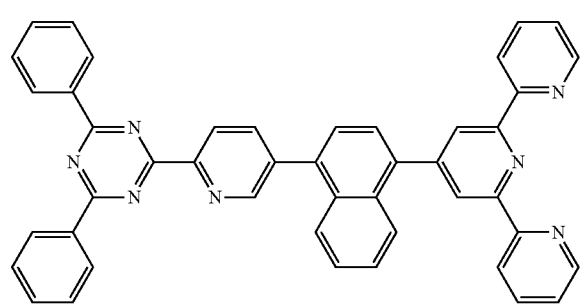
3-3
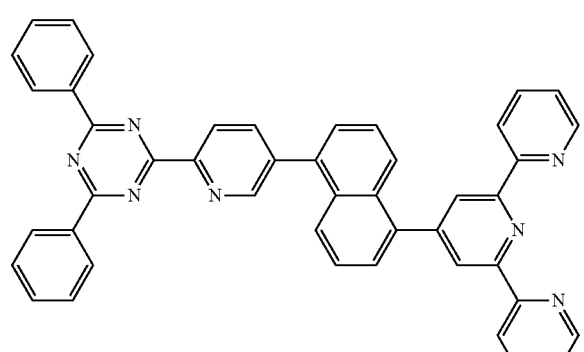
3-4
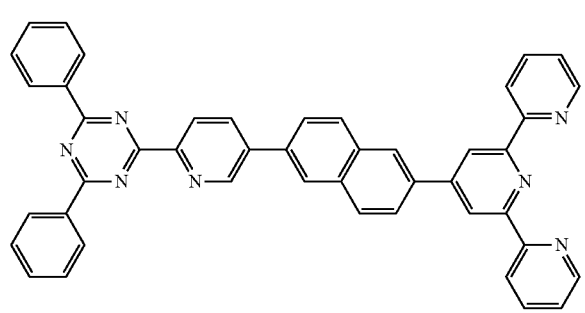
3-5
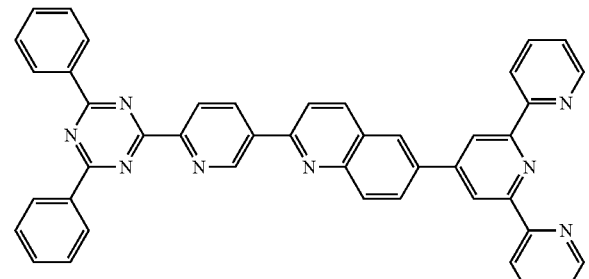
3-6
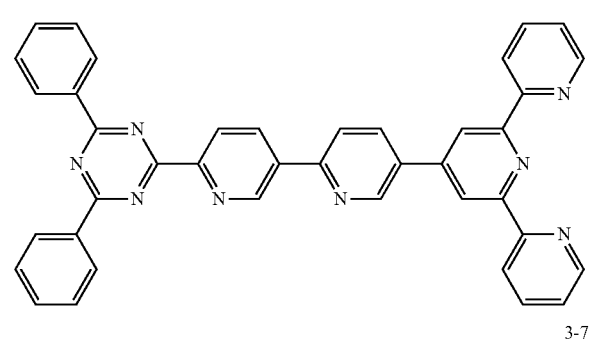
3-7
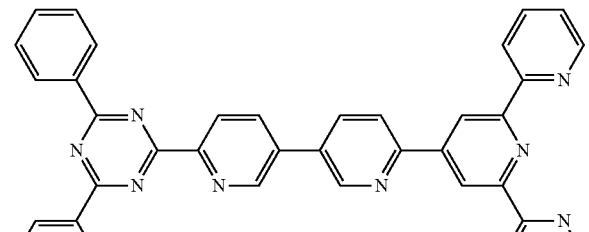
3-8
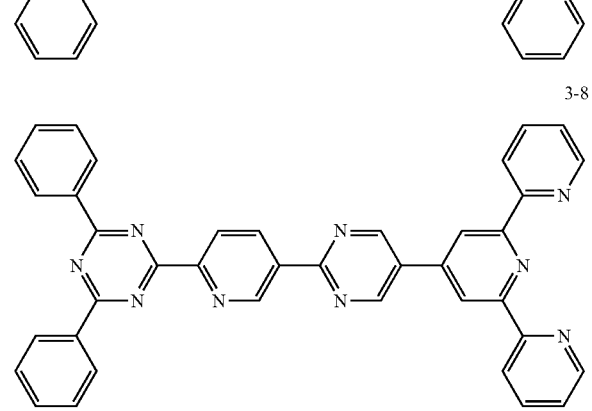
3-9
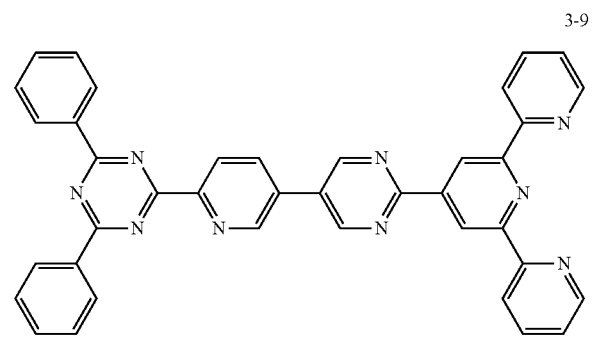 [SMILES: c1ccc(-c2nc(-c3ccccc3)nc(-c3ccc(-c4cnc(-c5cc(-c6ccccn6)nc(-c6ccccn6)c5)nc4)c4ccccc34)n2)cc1]

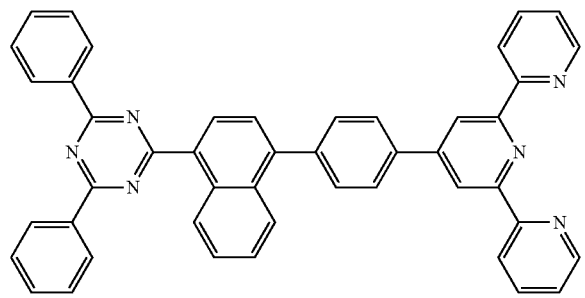
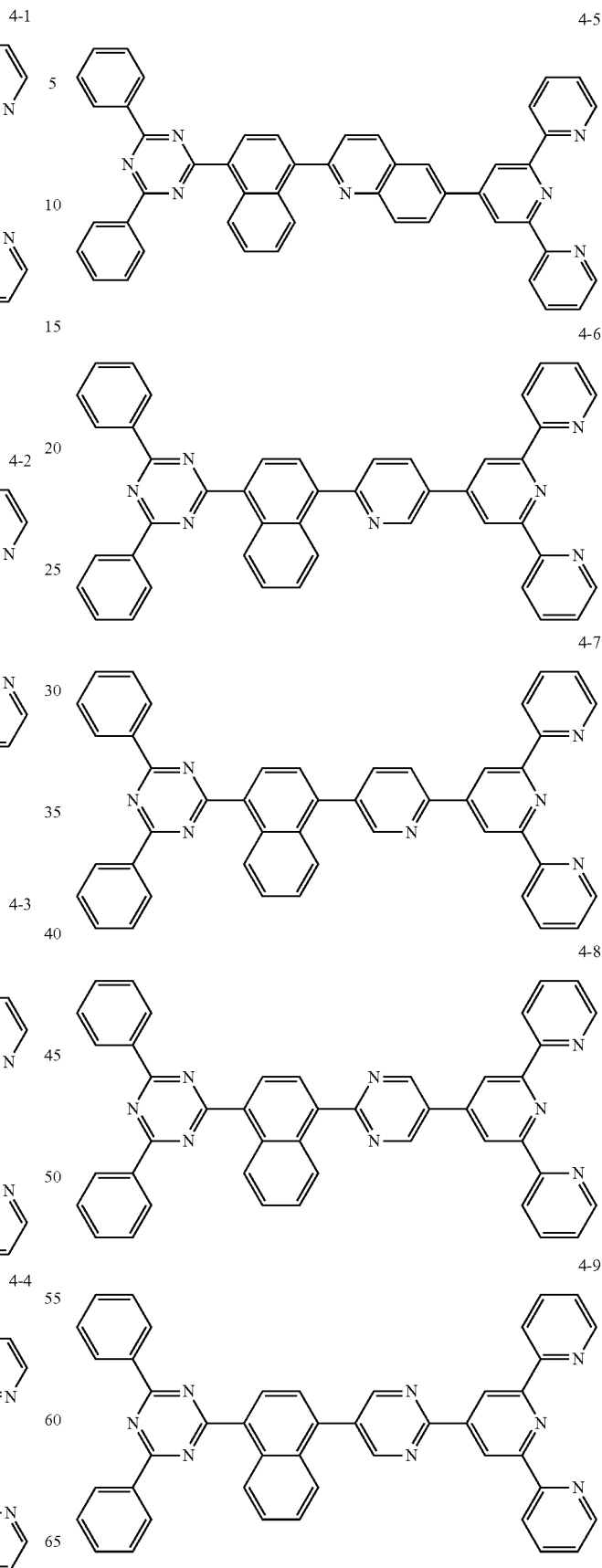

One of the at least two or more light emitting parts is a blue light emitting part, and the another one of the at least two or more light emitting parts is a yellow-green light emitting part.

The organic layer is included in the yellow-green light emitting part.

The organic layer includes an electron transport part and a charge generation part.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the disclosure and are incorporated in and constitute a part of this specification, illustrate embodiments of the invention and together with the description serve to explain the principles of the disclosure. In the drawings.

DETAILED DESCRIPTION

Figure 1:
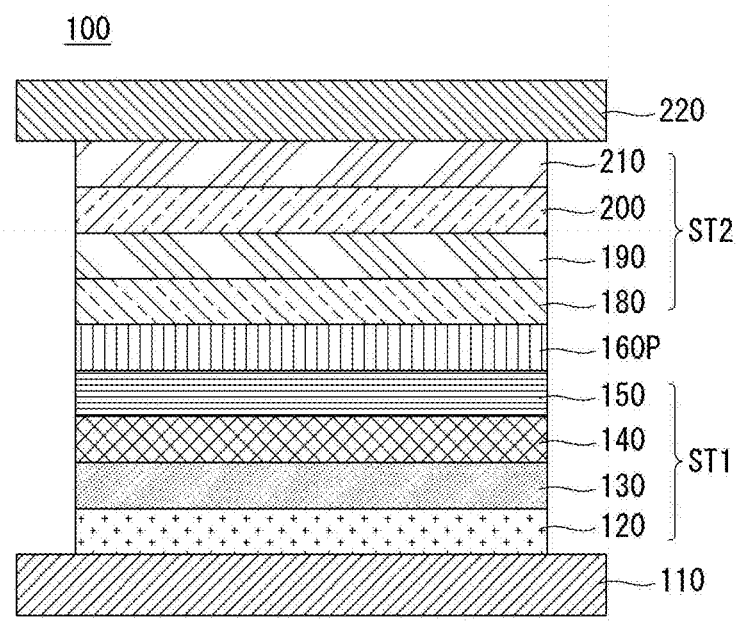
FIG. 1 is a cross-sectional view showing an organic light emitting display device according to a first exemplary embodiment of the present disclosure.

The advantages and features of the present disclosure and methods for accomplishing the same may be understood more readily by reference to the following detailed descriptions of exemplary embodiments and the accompanying drawings. The present disclosure may, however, be embodied in many different forms and should not be construed as being limited to the exemplary embodiments set forth herein. Rather, these exemplary embodiments are provided so that this disclosure will be thorough and complete and will fully convey the concept of the present disclosure to those skilled in the art, and the present disclosure is defined by the appended claims The shapes, sizes, percentages, angles, numbers, etc. shown in the figures to describe the exemplary embodiments of the present disclosure are merely examples and not limited to those shown in the figures. Like reference numerals denote like elements throughout the specification. In describing the present disclosure, detailed descriptions of related well-known technologies will be omitted to avoid unnecessary obscuring the present disclosure. When the terms 'comprise', 'have', 'consist of' and the like are used, other parts may be added as long as the term 'only' is not used. The singular forms may be interpreted as the plural forms unless explicitly stated.

The elements may be interpreted to include a margin of error even if not explicitly stated.

When the position relation between two parts is described using the terms 'on', 'over', 'under', 'next to' and the like, one or more parts may be positioned between the two parts as long as the term 'immediately' or 'directly' is not used.

When the temporal relationship between two events is described using the terms 'after', 'following', 'next', 'before' and the like, the two events may not occur in succession as long as the term 'immediately' or 'directly' is not used.

It will be understood that, although the terms first, second, etc., may be used to describe various elements, these elements should not be limited by these terms. These terms are only used to distinguish one element from another element. Thus, a first element discussed below could be termed a second element without departing from the technical spirit of the present disclosure.

The features of various exemplary embodiments of the present disclosure may be linked or combined with one another partly or wholly, and may technically interact or work together in various ways. The exemplary embodiments may be carried out independently or in combination with one another.

Hereinafter, various exemplary embodiments of the present disclosure will be described in detail with reference to the accompanying drawings.

Figure 2:
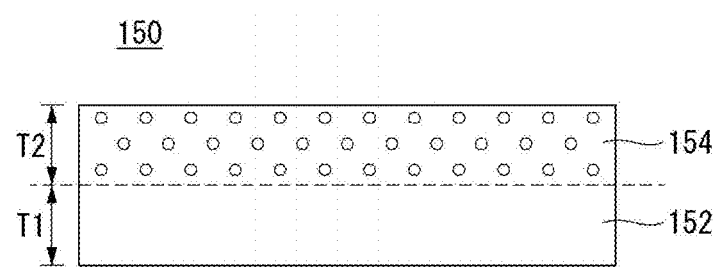
FIG. 2 is a view showing an example of an electron transport layer according to the present disclosure.
Figure 3:
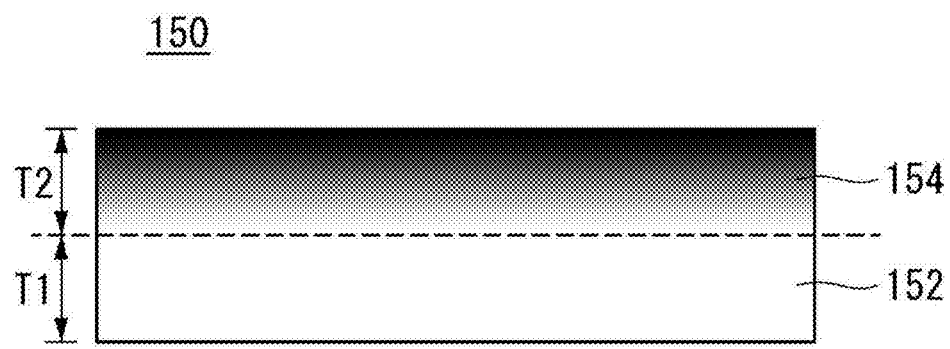
FIG. 3 is a view showing an example of an electron transport layer according to the present disclosure.

FIG. 1 is a cross-sectional view showing an organic light emitting display device according to a first exemplary embodiment of the present disclosure. FIG. 2 is a view showing an example of an electron transport layer according to the present disclosure. FIG. 3 is a view showing an example of an electron transport layer according to the present disclosure.

Referring to FIG. 1, an organic light emitting display device 100 according to the first exemplary embodiment of the present disclosure comprises first and second light emitting parts ST1 and ST2 between an anode 110 and a cathode 220, and a P-type charge generation layer 160P between the first light emitting part ST1 and the second light emitting part ST2.

The anode 110 is a hole injection electrode, and may be formed of one among ITO (indium tin oxide), IZO (indium zinc oxide), or ZnO (zinc oxide) having a high work function. Also, if the anode 110 is a reflective electrode, the anode 110 may further comprise a reflective layer formed of one among aluminum (Al), silver (Ag), or nickel (Ni) under a layer formed of one among ITO, IZO, or ZnO.

The first light emitting part ST1 is a single light emitting diode unit, and comprises a hole injection layer 120, a first hole transport layer 130, a first light emitting layer 140, and an electron functional layer 150.

The hole injection layer 120 may function to facilitate hole injection from the anode 110 to the first light emitting layer 140, and may be formed of, but is not limited to, one or more among CuPc (copper phthalocyanine), PEDOT (poly(3, 4)-ethylenedioxythiophene), PANI (polyaniline), and NPD (N,N'-bis(naphthalene-1-yl)-N,N'-bis(phenyl)-2, 2'-dimethylbenzidine). The hole injection layer 120 may be 1 to 150 nm thickness. If the hole injection layer 120 is 1 nm thickness or greater, the hole injection properties may be improved, or if the hole injection layer 120 is 150 nm thickness or less, an increase in the thickness of the hole injection layer 120 may be prevented and a rise in operating voltage may be therefore prevented. The hole injection layer 120 may not be included in the elements of the organic light emitting display device, depending on the structure or characteristics of the organic light emitting display device.

The first hole transport layer 130 may function to facilitate hole transport, and may be formed of, but is not limited to, one or more among NPD (N,N'-bis(naphthalene-1-yl)-N,N'-bis(phenyl)-2,2'-dimethylbenzidine), TPD (N,N'-bis-(3-methylphenyl)-N,N'-bis(phenyl)-benzidine), spiro-TAD (2,2'7,7'-tetrakis(N,N-diphenylamino)-9,9'-spirofluorene), and MTDATA (4,4',4"-Tris(N-3-methylphenyl-N-phenylamino)-triphenylamine). The first hole transport layer 130 may be 1 to 150 nm thickness. If the first hole transport layer 130 is 1 nm thickness or greater, the hole transport properties may be improved, or if the first hole transport layer 130 is 150 nm thickness or less, an increase in the thickness of the first hole transport layer 130 may be prevented, and a rise in operating voltage may be therefore prevented.

The first light emitting layer 140 may emit light of red (R), green (G), blue (B), or yellow-green (YG), and may be formed of a phosphorescent material. In this exemplary embodiment, the first light emitting layer 140 may be a light emitting layer that emits yellow-green light. The first light emitting layer 140 may have a single layer structure of a yellow-green light emitting layer or green light emitting layer, or a multilayer structure formed of a yellow-green light emitting layer and a green light emitting layer. The first light emitting layer 140 comprises a yellow-green light emitting layer, a green light emitting layer, or a multilayer structure formed of a yellow-green light emitting layer and a green light emitting layer, of a yellow light emitting layer and a red light emitting layer, of a green light emitting layer and a red light emitting layer, or of a yellow-green light emitting layer and a red light emitting layer. This exemplary embodiment will be described by taking as an example a single layer structure of a first light emitting layer 140 that emits yellow-green light. The first light emitting layer 140 may include, but is not limited to, at least one host of CBP (4,4'-bis(carbazol-9-yl)biphenyl) or BAlq (Bis(2-methyl-8-quinolinolato)-4-(phenylphenolato)aluminum) and a phosphorescent yellow-green dopant that emits yellow-green light.

Also, an organic light emitting display device with a multi-layer emission structure comprises an electron transport layer and an N-type charge generation layer that are on the first light emitting layer. Since the electron transport layer and the N-type charge generation layer are formed of materials with characteristics suited to their roles, a deposition chamber setup is required for each material before these materials are deposited. Due to this, the process will take a long time, resulting in low productivity. Moreover, the materials of the electron transport layer and N-type charge generation layer are organic compounds involving high material costs, thus leading to increased manufacturing costs. Accordingly, the present inventors conducted several tests or experiments to reduce the manufacturing costs and improve the efficiency and lifetime of the device by reducing the number of organic functional layers of the organic light emitting display device with the multi-layer emission structure.

Through a number of tests or experiments which were performed on materials that can reduce the number of organic functional layers, that do not affect the lifetime or efficiency of the organic light emitting display device, and that cause no rise in operating voltage, the present inventors developed compounds that can serve as an electron transport layer and an N-type charge generation layer. A compound of this disclosure comprises a triazine compound as a functional group with high electron mobility and a terpyridine compound as a functional group that has a short bond length and includes heteroatoms that react with alkali metals, such as lithium (Li), or alkali earth metals. Accordingly, the compound of this disclosure has the characteristics of an electron transport layer with high electron mobility and also the characteristics of an N-type charge generation layer that has excellent electron injection and generation properties and high electron mobility by reacting with lithium (Li). Also, the compound of this disclosure is an aromatic compound, which rarely break apart due to the short conjugation, in which a triazine derivative and the terpyridine compound are connected to prevent a decrease in electron mobility.

Accordingly, the electron functional layer 150 is formed of a compound represented by the following Chemical Formula 1:

[Chemical Formula 1]

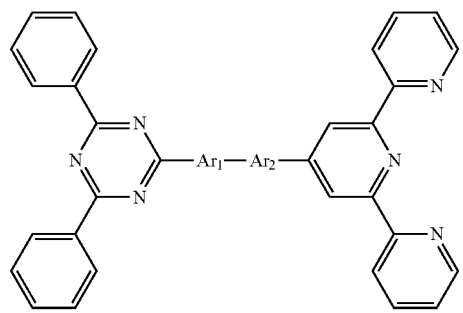

wherein $Ar_1$ and $Ar_2$ include independently a substituted or unsubstituted aromatic or heteroaromatic compound of 6 to 12 carbon atoms that has a molecular weight of 70 to 150. Here, if $Ar_1$ and $Ar_2$ in Chemical Formula 1 are independently an aromatic or heteroaromatic compound of 13 or more carbon atoms, the energy bandgap is small because the conjugation is too long. This leads to a large difference in energy bandgap between the electron functional layer 150 and an adjacent layer, e.g., the light emitting layer, which acts as a resistance. Thus, $Ar_1$ and $Ar_2$ are independently formed of an aromatic or heteroaromatic compound of 12 or less carbon atoms and are connected in the para form so that the conjugation is not broken, thereby preventing a decrease in electron mobility.

The compound of this disclosure represented by Chemical Formula 1 includes one of the following compounds represented by Chemical Formulae 2 to 5:

[Chemical Formula 2]

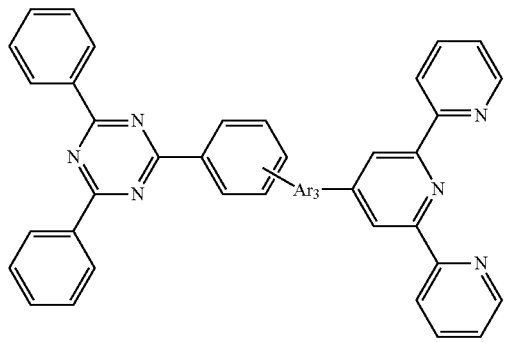

[Chemical Formula 3]
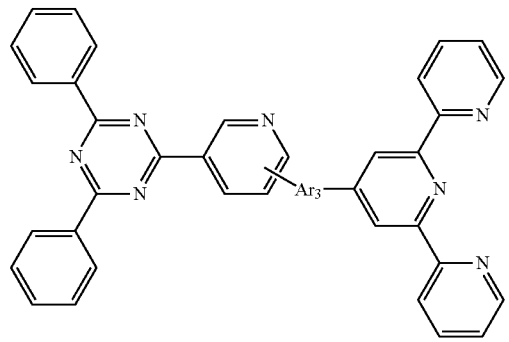
[Chemical Formula 4]
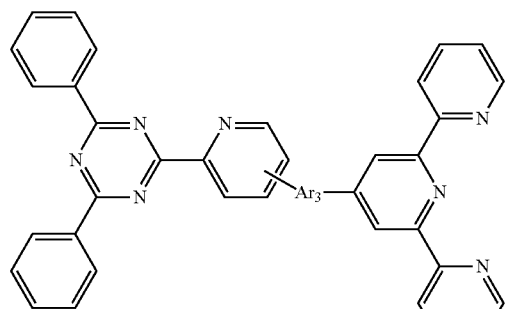
[Chemical Formula 5]
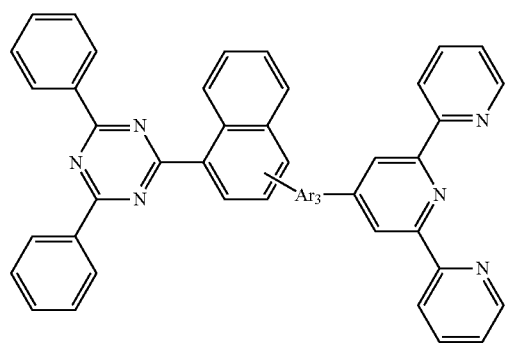
wherein Ar₃ includes a substituted or unsubstituted aromatic or heteroaromatic compound of 6 to 12 carbon atoms that has a molecular weight of 70 to 150.
The compound represented by Chemical Formula 1 includes one of the following compounds:
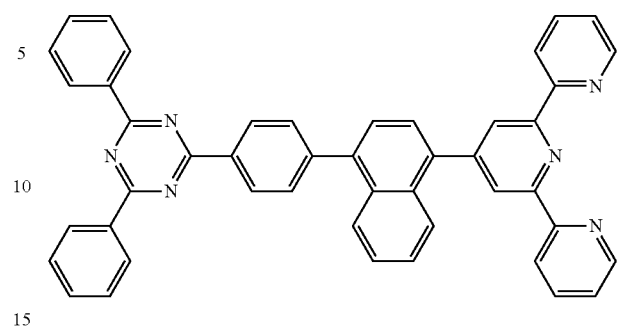
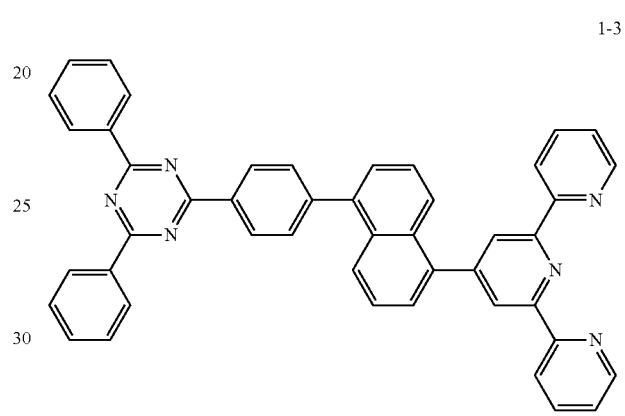
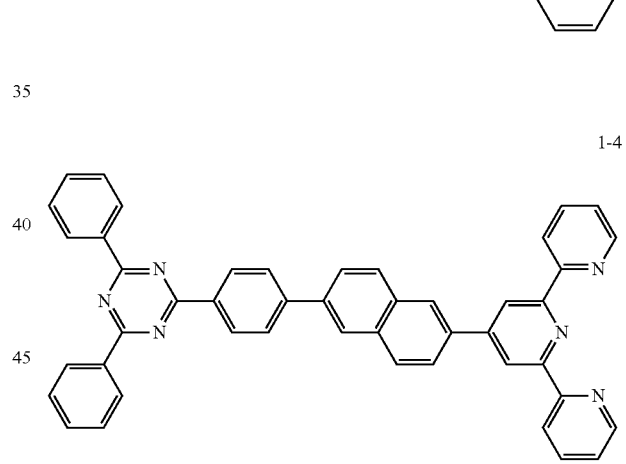
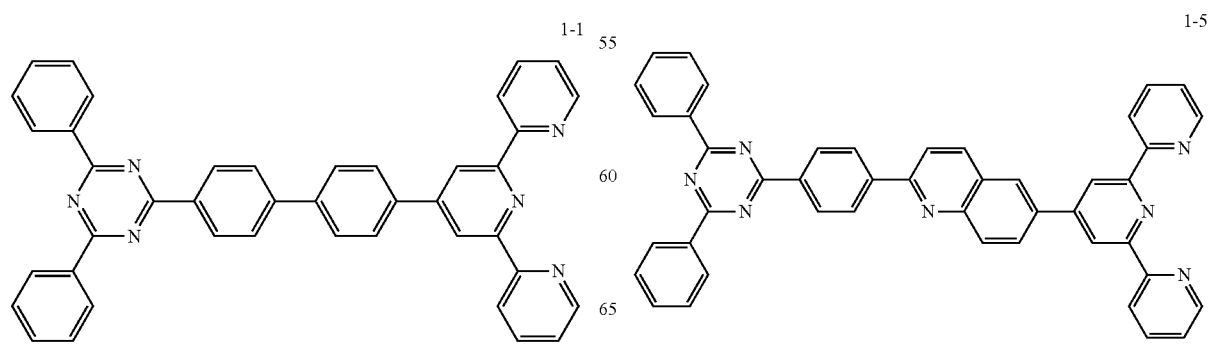

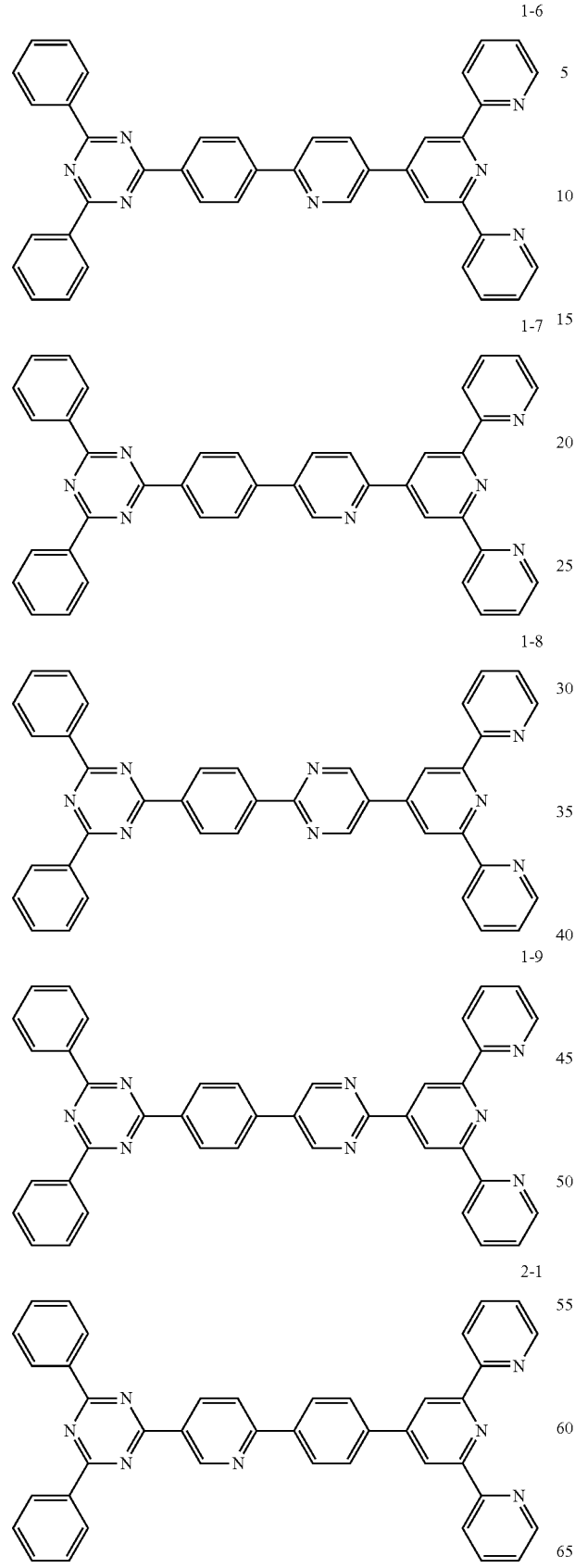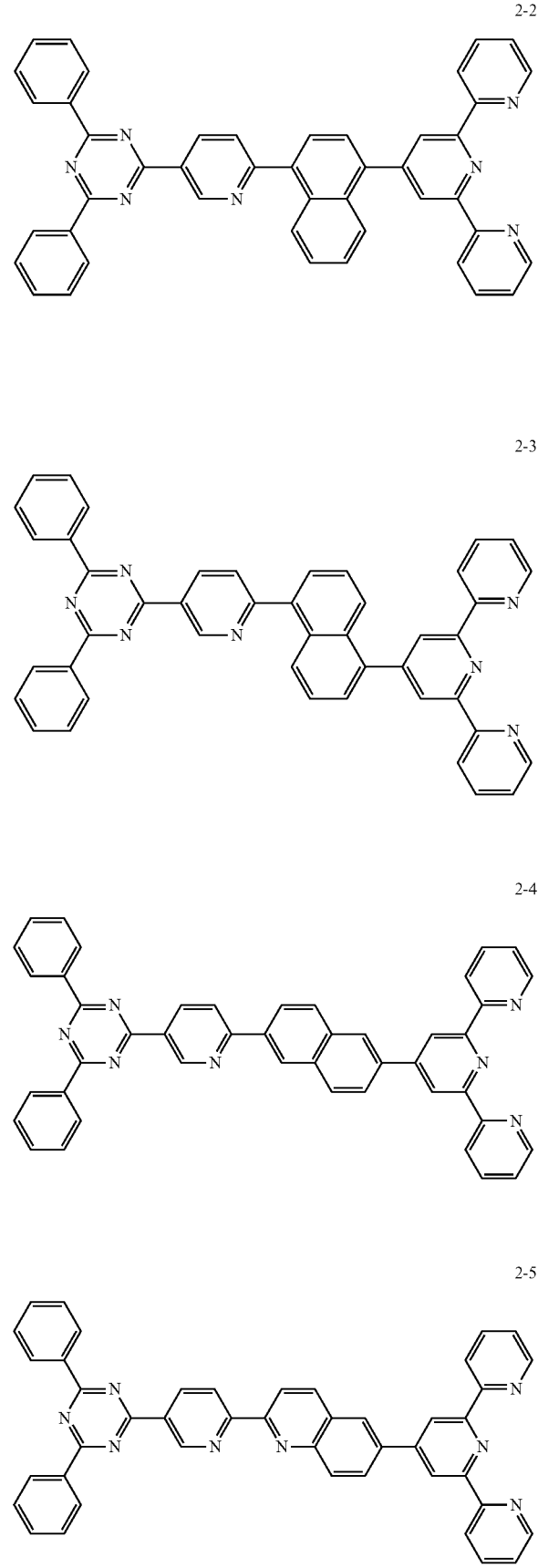

-continued
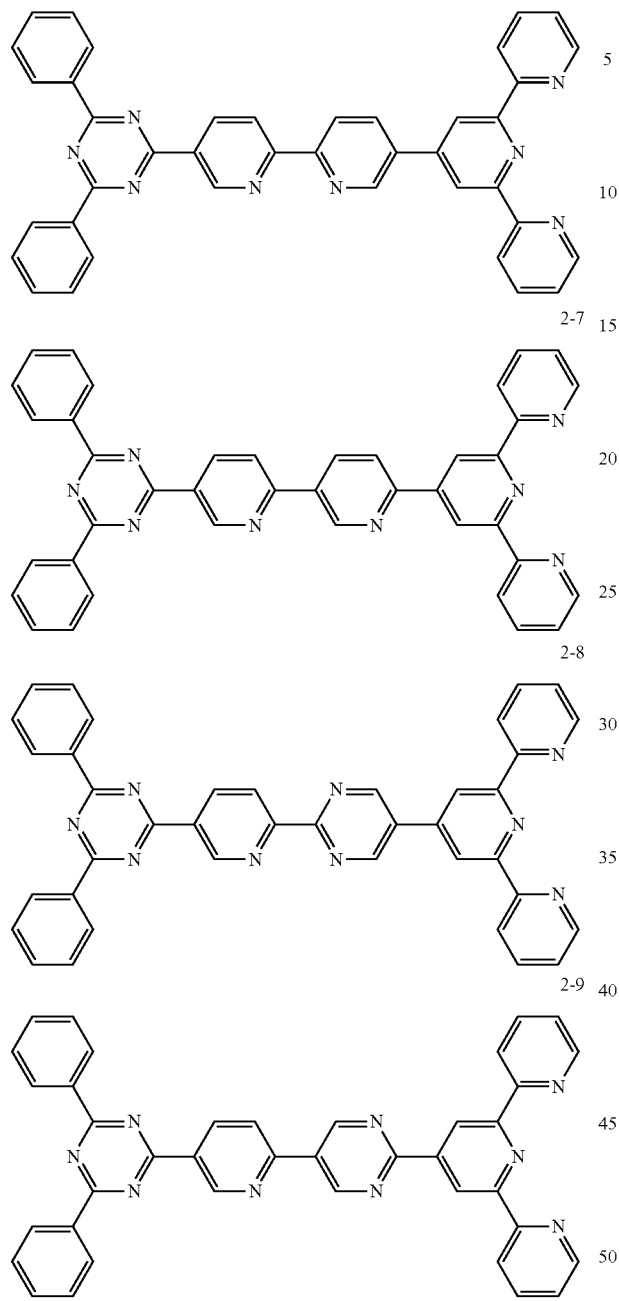
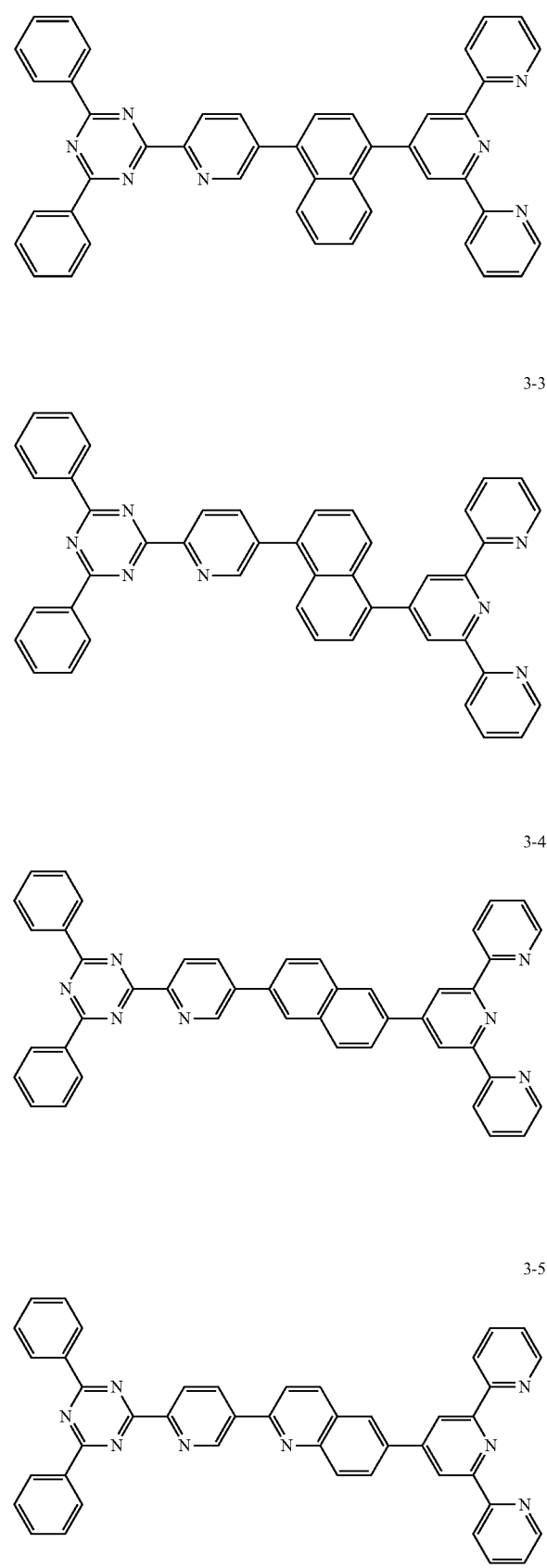

3-6
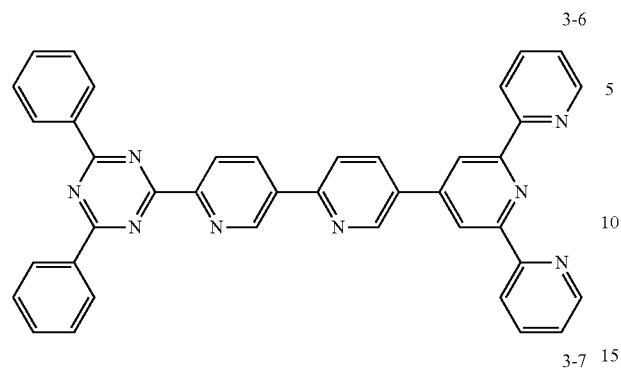
3-7
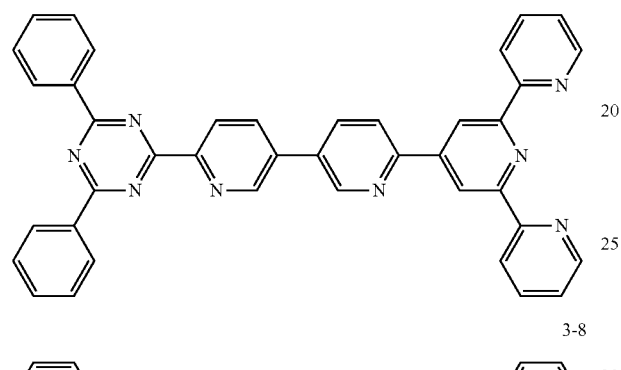
3-8
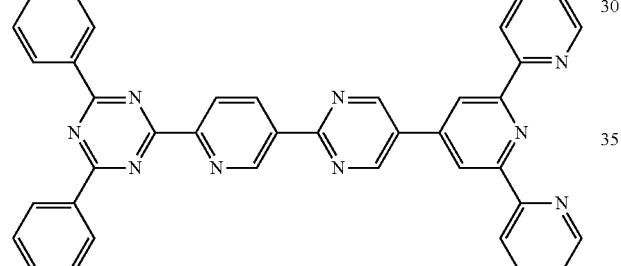
3-9
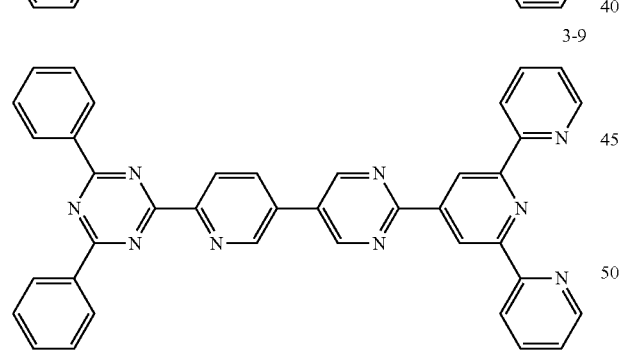
4-1
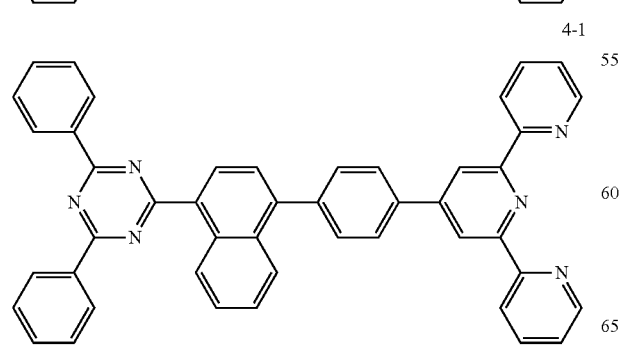
4-2
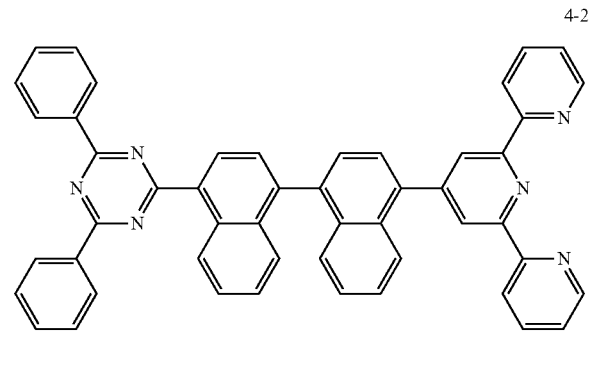 [SMILES: c1ccc(-c2nc(-c3ccccc3)nc(-c3ccc(-c4cnc(-c5cc(-c6ccccn6)nc(-c6ccccn6)c5)nc4)c4ccccc34)n2)cc1]
4-3
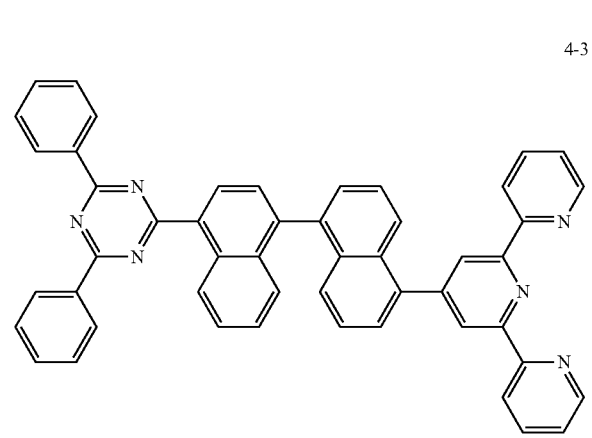
4-4
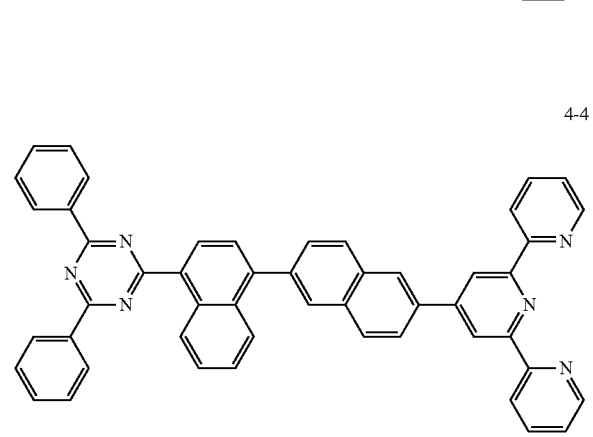
4-5
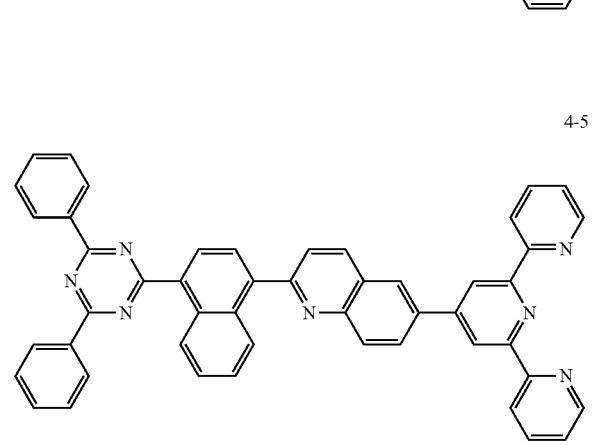

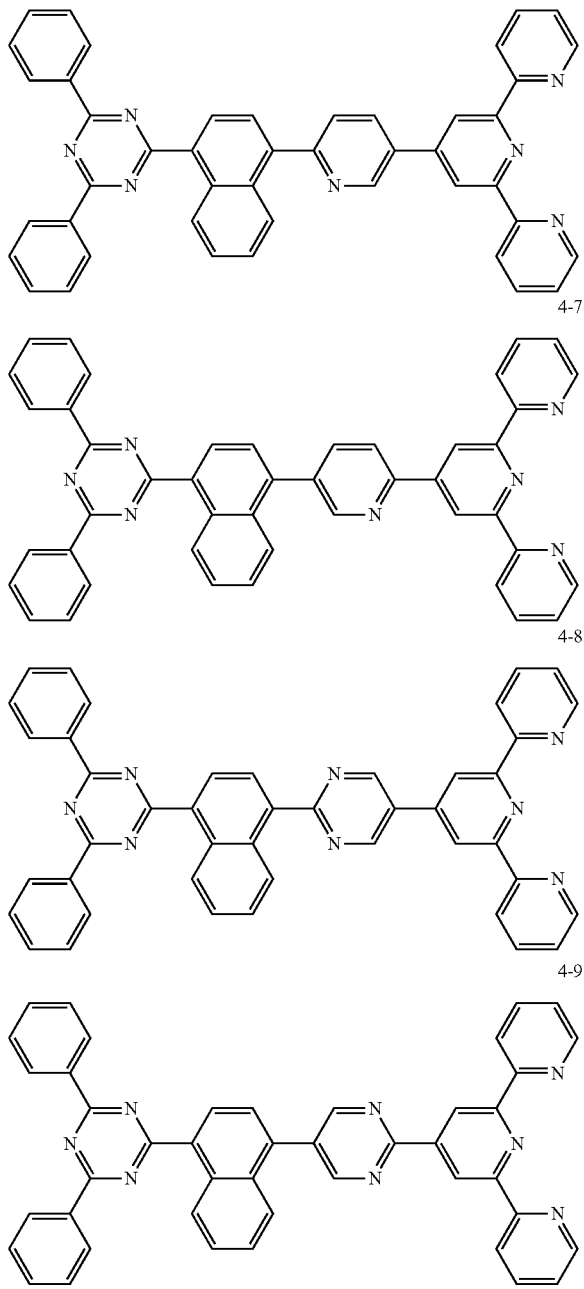

The electron functional layer 150 of this disclosure comprises a compound represented by the above Chemical Formula 1 and an alkali metal or alkali earth metal.

Referring to FIG. 2, the electron functional layer 150 comprises an electron transport part 152 and a charge generation part 154. The electron transport part 152 is adjacent to the first light emitting layer 140 and serves to transport electrons, and is formed of the compound represented by the above Chemical Formula 1. This compound may facilitate the transport of electrons by the electron transport part 152 by comprising a triazine compound with high electron mobility. The charge generation layer 154 is on the electron transport part 152 and serves to inject electrons, and comprises the above compound and an alkali metal or alkali earth metal. This compound may facilitate the injection and generation of electrons by the charge generation part 154 by comprising a terpyridine compound including heteroatoms that react with alkali metals, such as lithium (Li), or alkali earth metals.

The charge generation part 154 is formed of a mixture of a compound of this disclosure and an alkali metal or alkali earth metal, and the electron transport part 152 is formed only of a compound of this disclosure. If the compound of this disclosure and the alkali metal or alkali earth metal are mixed together in the charge generation part 154, they react with each other and hence the charge generation part 154 may function as a charge generation layer because it has electron injection and generation properties. Also, if the electron transport part 152 is formed only of a compound of this disclosure, it may function as an electron transport layer because of the high electron mobility of the compound. The compound of this disclosure has a HOMO (highest occupied molecular orbital) level ranging from −5.5 to −6.5 eV and a LUMO (lowest unoccupied molecular orbital) level ranging from −2.5 to −3.5 eV, in order to have electron transport, injection, and generation properties.

The electron transport part 152 and charge generation part 154 in the electron functional layer 150 may be sectioned off depending on whether an alkali metal or alkali earth metal is mixed in them. The percentage of the alkali metal or alkali earth metal to be mixed in the charge generation part 154 may be 3% or less. Also, the alkali metal or alkali earth metal in the charge generation part 154 may be uniformly mixed, as illustrated in FIG. 2, or may have a concentration gradient, as illustrated in FIG. 3. Here, if the alkali metal or alkali earth metal has a concentration gradient in the charge generation part 154, the concentration of the alkali metal or alkali earth metal may increase from areas adjacent to the electron transport part 152 toward the top of the charge generation part 154.

Moreover, the total thickness (T1+T2) of the electron functional layer 150 is 300 to 500 Å. Here, if the total thickness (T1+T2) of the electron functional layer 150 is 300 Å or greater, the electron generation part 154 and electron transport part 152 of the electron functional layer 150 may exhibit electron injection and transport properties, and if the total thickness (T1+T2) of the electron functional layer 150 is 550 Å or greater, this may prevent a rise in operating voltage caused by the increased thickness (T1+T2) of the electron functional layer 150. In this case, the thickness T1 of the electron transport part 152 may be 150 to 250 Å, and the thickness T2 of the charge generation part 154 may be the remainder left after subtracting the thickness of the electron transport part 152 from the total thickness (T1+T2). If the thickness T1 of the electron transport part 152 is 150 Å or greater, the electron transport part 152 may be formed with a minimum thickness required to exhibit electron transport properties, and if the thickness T1 of the electron transport part 152 is 250 Å or less, this may prevent a rise in operating voltage caused by the increased thickness T1 of the electron transport part 152 and ensure the minimum thickness of the charge generation part 154.

A compound of this disclosure comprises a triazine compound as a functional group with high electron mobility to facilitate electron transport, and a terpyridine compound as a functional group that has a short bond length and includes heteroatoms that react with alkali metals, such as lithium (Li), or alkali earth metals, to facilitate electron injection and generation. Accordingly, the compound of this disclosure has the characteristics of an electron transport layer with high electron mobility and also the characteristics of an N-type charge generation layer that has excellent electron injection and generation properties and high electron mobility because the compound reacts with alkali metals or alkali earth metals. Also, the compound for the electron functional layer according to this disclosure is an aromatic compound, which rarely breaks apart due to the short conjugation, in which a triazine derivative and the terpyridine compound are connected to prevent a decrease in the electron mobility of the compound for the electron functional layer.

Accordingly, forming the electron functional layer by mixing an alkali metal or alkali earth metal with a compound of this disclosure may facilitate the injection, generation, and transport of electrons in the electron functional layer, thereby improving the efficiency and lifetime of the device. Also, the present disclosure may reduce the manufacturing costs of the organic light emitting display device and improve its productivity by forming an electron function layer as the electron transport layer and the N-type charge generation layer.

A P-type charge generation layer 160P is between the first light emitting part ST1 and the second light emitting part. The first light emitting part ST1 and the second light emitting part ST2 are connected by the P-type charge generation layer 160P. The P-type charge generation layer 160P may be a PN-junction charge generation layer attached to the charge generation part 154 of the electron functional layer 150. The PN-junction P-type charge generation layer 160P and the charge generation part 154 of the electron functional layer 150 generate a charge, or inject the charge, i.e., electrons and holes, separately into the light emitting layer. That is, the charge generation part 154 of the electron functional layer 150 transfers electrons to the electron transport part 152 of the electron functional layer 150, and the electron transport part 152 supplies the electrons to the first light emitting layer 140 adjacent to the anode. The P-type charge generation layer 160P transfers holes to a second hole transport layer 180 to supply the holes to a second light emitting layer 190 of the second light emitting part ST2, thereby further increasing the light emission efficiency of the first and second light emitting layers 140 and 190 and reducing the operating voltage.

The P-type charge generation layer 160P may be formed of a metal or a P-doped organic material. The metal may be one or more alloys among Al, Cu, Fe, Pb, Zn, Au, Pt, W, In, Mo, Ni, and Ti. A P-type dopant and host for the P-doped organic material may be generally-used materials. For example, the P-type dopant may be one material among $F_4$-TCNQ (2,3,5,6-tetrafluoro-7,7,8,8,-tetracyanoquinodimethane), a derivative of tetracyanoquinodimethane, iodine, $FeCl_3$, $FeF_3$, and $SbCl_5$. The host may be one material among NPB (N,N'-bis(naphthalene-1-yl)-N,N'-bis(phenyl)-benzidine), TPD (N,N'-bis-(3-methylphenyl)-N,N'-bis(phenyl)-benzidine), and TNB (N,N,N'N'-tetranaphthalenyl-benzidine).

The second light emitting part ST2 comprising a second hole transport layer 180, the second light emitting layer 190, an electron transport layer 200, and an electron injection layer 210 is on the P-type charge generation layer 160P.

The second light emitting layer 190 may emit light of red (R), green (G), blue (B), or yellow (Y), and may be formed of a phosphorescent or fluorescent material. The second light emitting layer 190 may be a blue light emitting layer in this exemplary embodiment. The blue light emitting layer comprises one among a blue light emitting layer, a dark blue light emitting layer, and a sky blue light emitting layer. Alternatively, the second light emitting layer 190 may be formed of a blue light emitting layer and a red light emitting layer, of a blue light emitting layer and a yellow-green light emitting layer, or of a blue light emitting layer and a green light emitting layer.

If the second light emitting layer 190 is a blue light emitting layer, it may be formed of a phosphorescent material comprising a host material such as CBP (4,4'-bis(carbazol-9-yl)biphenyl) and a dopant material including an iridium-based material. Alternatively, the second light emitting layer 190 may be formed of, but not limited to, a fluorescent material including one among spiro-BDAVBi (2,7-bis)4-diphenylamino)styryl)-9,9-spirofluorenespiro-CBP (2,2',7,7'-tetrakis(carbazol-9-yl)-9,9-spirofluorene), distyrylbenzene (DSB), distyrylarylene (DSA), a PFO polymer, and a PPV polymer.

The second light emitting part ST2 comprises the second hole transport layer 180 between the P-type charge generation layer 160P and the second light emitting layer 190, and comprises the electron transport layer 200 and the electron injection layer 210 on the second light emitting layer 190. The second hole transport layer 180 may have the same composition as the first hole transport layer 130 of the first light emitting part ST1 or have a different composition from that of the first hole transport layer 130.

The electron transport layer 200 may be formed of, but is not limited to, $Alq_3$ (tris(8-hydroxyquinolinato)aluminum), PBD (2-4-biphenyl)-5-(4-tert-butylphenyl)-1,3,4-oxadiazole), TAZ (3-(4-biphenyl)-4-pheynyl-5-tert-butylphenyl-1, 2,4-triazole), or BAlq (Bis(2-methyl-8-quinolinolato)-4-(phenylphenolato)aluminum). The electron transport layer 200 may be 1 to 50 nm thickness. If the electron transport layer 200 is 1 nm thickness or greater, a degradation of the electron transport properties may be prevented, or if the electron transport layer 200 is 50 nm thickness or less, an increase in the thickness of the electron transport layer 200 may be prevented, and a rise in operating voltage may be therefore prevented.

The electron injection layer 210 functions to facilitate electron injection, and may be formed of, but is not limited to, $Alq_3$ (tris(8-hydroxyquinolinato)aluminum), PBD (2-4-biphenyl)-5-(4-tert-butylphenyl)-1,3,4-oxadiazole), TAZ (3-(4-biphenyl)-4-pheynyl-5-tert-butylphenyl-1,2,4-triazole), or BAlq (Bis(2-methyl-8-quinolinolato)-4-(phenylphenolato)aluminum). On the other hand, the electron injection layer 210 may be formed of a metal compound, and the metal compound may be, for example, but is not limited to, one or more among LiQ, LiF, NaF, KF, RbF, CsF, FrF, $BeF_2$, $MgF_2$, $CaF_2$, $SrF_2$, $BaF_2$, and $RaF_2$. The electron injection layer 210 may be 1 to 50 nm thickness. If the electron injection layer 210 is 1 nm thickness or greater, a degradation of the electron injection properties may be prevented, or if the electron injection layer 210 is 50 nm thickness or less, an increase in the thickness of the electron injection layer 210 may be prevented, and a rise in operating voltage may be therefore prevented.

Accordingly, the second light emitting part ST2 comprising the second hole transport layer 180, the second light emitting layer 190, the electron transport layer 200, and the electron injection layer 210 is formed on the P-type charge generation layer 160P.

The cathode 220 is provided on the second light emitting part ST2. The cathode 220 is an electron injection electrode, and may be formed of magnesium (Mg), calcium (Ca), aluminum (Al), silver (Ag), or an alloy thereof, having a low work function. If the organic light emitting display device is a top-emission type or a dual-emission type, the cathode 220 may be formed thin enough to pass light therethrough. If the organic light emitting display device is a bottom-emission type, the cathode 220 may be formed thick enough to reflect light.

Accordingly, the organic light emitting display device according to the first exemplary embodiment of the present disclosure is formed by comprising the first light emitting part ST1, P-type charge generation layer 160P, second light emitting part ST2, and cathode 220 on the anode 110.

The above-described compound of this disclosure is included in the first light emitting part ST1 comprising a yellow-green light emitting layer. For the yellow-green light emitting layer, an organic layer with high electron mobility to a phosphorescent light emitting layer is required. The compound of this disclosure may be suitable as the phosphorescent light emitting layer since it has high electron mobility. Accordingly, if the compound of this disclosure is included in the first light emitting part ST1, the electron mobility of the first light emitting part ST1 becomes higher. Therefore, it is preferable that the compound of this disclosure is in the first light emitting part ST1 which emits yellow-green phosphorescent light. Alternatively, if the phosphorescent light emitting layer is in the second light emitting part ST2, the compound of this disclosure may be in the second light emitting part ST2.

A compound of this disclosure comprises a triazine compound as a functional group with high electron mobility to facilitate electron transport, and a terpyridine compound as a functional group that has a short bond length and includes heteroatoms that react with alkali metals, such as lithium (Li), or alkali earth metals, to facilitate electron injection and generation. Accordingly, the compound of this disclosure has the characteristics of an electron transport layer with high electron mobility and also the characteristics of an N-type charge generation layer that has excellent electron injection and generation properties and high electron mobility because the compound reacts with alkali metals or alkali earth metals. Also, the compound for the electron functional layer according to this disclosure is an aromatic compound, which rarely breaks apart due to the short conjugation, in which a triazine derivative and the terpyridine compound are connected to prevent a decrease in the electron mobility of the compound for the electron functional layer.

Accordingly, forming the electron functional layer by mixing an alkali metal or alkali earth metal with a compound of this disclosure may facilitate the injection, generation, and transport of electrons in the electron functional layer, thereby improving the efficiency and lifetime of the device. Also, the present disclosure may reduce the manufacturing costs of the organic light emitting display device and improve its productivity by forming an electron function layer as the electron transport layer and the N-type charge generation layer.

Figure 4:
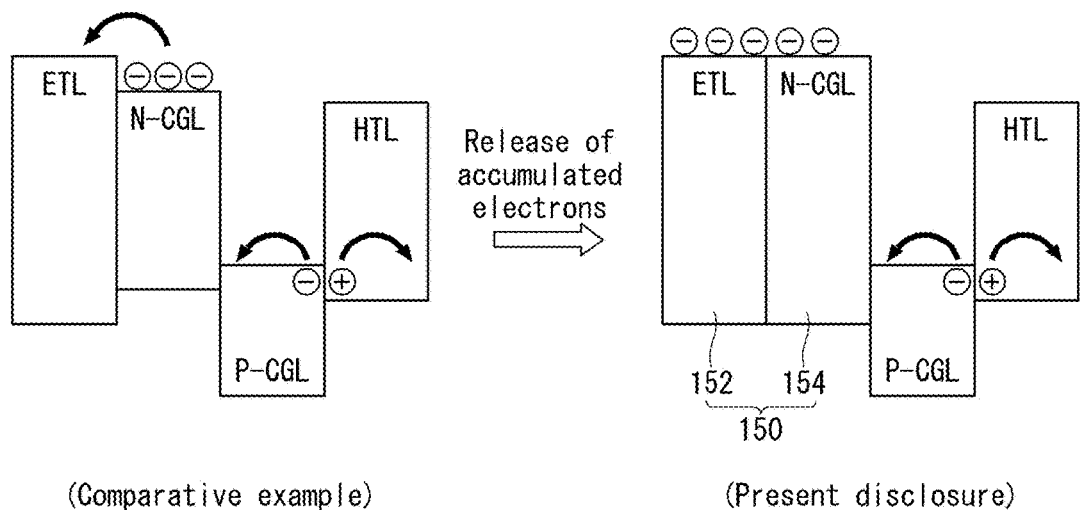
FIG. 4 is a view showing an energy band diagram of an organic light emitting display device.

FIG. 4 is an energy band diagram of an organic light emitting display device.

Referring to FIG. 4, a comparative example of organic light emitting display device comprises a hole transport layer HTL, a P-type charge generation layer P-CGL, an N-type charge generation layer N-CGL, and an electron transport layer ETL. The N-type charge generation layer N-CGL supplies electrons to the electron transport layer ETL adjacent to it, and the P-type charge generation layer P-CGL supplies holes to the hole transport layer HTL adjacent to it. However, since the N-type charge generation layer N-CGL and the electron transport layer ETL are formed of different materials, the energy bandgap difference becomes a barrier, thus leading to an accumulation of electrons.

The organic light emitting display device of this disclosure comprises an electron functional layer 150 comprising a charge generation part 154 functioning as the N-type charge generation layer and an electron transport part 152 functioning as the electron transport layer. In this case, the electron transport part 152 and charge generation part 154 of the electron functional layer 150 are formed of the same material, except that an alkali metal or alkali earth metal is included in the charge generation part 154. Thus, the electron transport part 152 and the charge generation part 154 have the same energy bandgap, and hence there exists no barrier caused by a difference in energy bandgap, which allows electrons to move easily. Accordingly, the transport and injection of electrons in the electron functional layer 150 may be improved, thereby improving light emission efficiency and the lifetime of the device.

Figure 5:
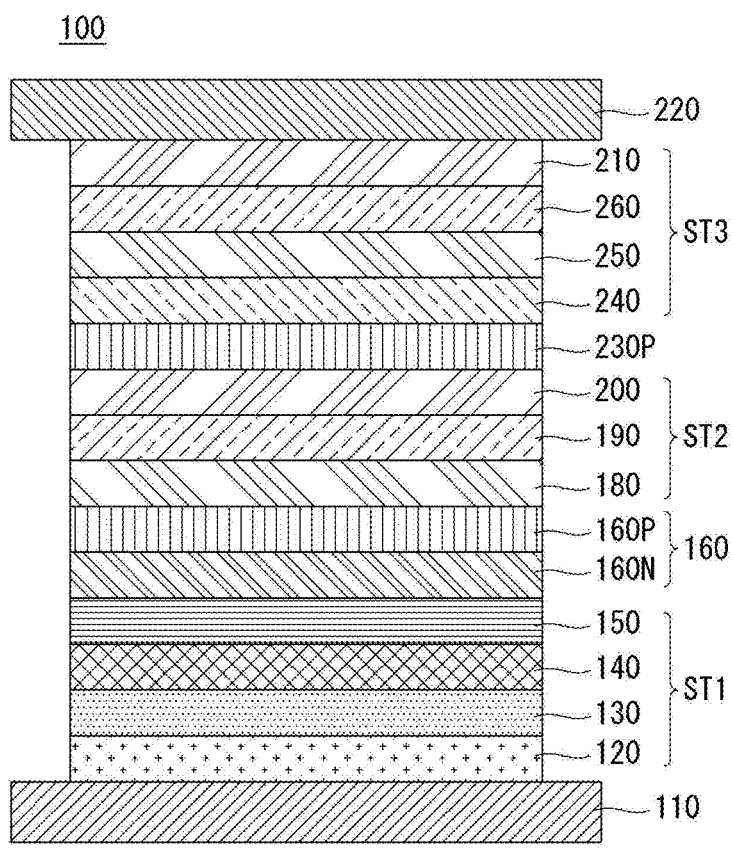
FIG. 5 is a cross-sectional view showing an organic light emitting display device according to a second exemplary embodiment of the present disclosure.

FIG. 5 is a cross-sectional view showing an organic light emitting display device according to a second exemplary embodiment of the present disclosure. The same elements as the first exemplary embodiment are denoted by the same reference numerals, so descriptions of these elements will be omitted below.

Referring to FIG. 5, an organic light emitting display device 100 of the present disclosure comprises a plurality of light emitting parts ST1, ST2, and ST3 between an anode 110 and a cathode 220, and a first charge generation layer 160 and a P-type charge generation layer 230P that are between the light emitting parts ST1, ST2, and ST3. Although this exemplary embodiment has been illustrated and described with an example where three light emitting parts are between the anode 110 and the cathode 220, the present disclosure is not limited to this example and four or more light emitting parts may be between the anode 110 and the cathode 220.

Among the light emitting parts, the first light emitting part ST1 comprises a first light emitting layer 140. The first light emitting layer 140 may emit light of red, green, or blue: for example, it may be a blue light emitting layer in this exemplary embodiment. The blue light emitting layer comprises one among a blue light emitting layer, a dark blue light emitting layer, and a sky blue light emitting layer. Alternatively, the first light emitting layer 140 may be formed of a blue light emitting layer and a red light emitting layer, of a blue light emitting layer and a yellow-green light emitting layer, or of a blue light emitting layer and a green light emitting layer.

The first light emitting part ST1 comprises a hole injection layer 120 and a first hole transport layer 130 that are between the anode 110 and the first light emitting layer 140, and a first electron transport layer 150 on the first light emitting layer 140. Accordingly, the first light emitting part ST1 comprising the hole injection layer 120, first hole transport layer 130, first light emitting layer 140, and first electron transport layer 150 is formed on the anode 110. The hole injection layer 120 may not be included in the elements of the first light emitting part ST1, depending on the structure or characteristics of the device.

The second light emitting part ST2 comprising a second light emitting layer 190 is on the first light emitting part ST1. The second light emitting layer 190 may emit light of red, green, or blue: for example, it may be a yellow-green light emitting layer in this exemplary embodiment. The second light emitting layer 190 may comprise a yellow-green light emitting layer, a green light emitting layer, or a multilayer structure formed of a yellow-green light emitting layer and a green light emitting layer, of a yellow light emitting layer and a red light emitting layer, of a green light emitting layer and a red light emitting layer, or of a yellow-green light emitting layer and a red light emitting layer. The second light emitting part ST2 further comprises a second hole transport layer 180 on the first light emitting part ST1, and comprises an electron functional layer 200 on the second light emitting layer 190. Accordingly, the second light emitting part ST2 comprising the second hole transport layer 180, second light emitting layer 190, and electron functional layer 200 is formed on the first light emitting part ST1.

The electron functional layer 200 of this disclosure may have electron transport properties and electron generation properties by comprising a triazine compound as a functional group with high electron mobility and a terpyridine compound that has a short bond length and includes heteroatoms that react with alkali metals, such as lithium (Li), or alkali earth metals. Accordingly, an electron functional layer comprising an electron transport part with electron transport properties and a charge generation part with charge generation properties may be formed by mixing a compound for the electron functional layer with an alkali metal or alkali earth metal. Therefore, the electron functional layer of this disclosure functions as an electron generation layer and an N-type charge generation layer, so it offers the advantage of improving the lifetime and efficiency of the organic light emitting display device and reducing manufacturing costs.

A first charge generation layer 160 is between the first light emitting part ST1 and the second light emitting part ST2. The first charge generation layer 160 is a PN-junction charge generation layer formed by joining an N-type charge generation layer 160N and a P-type charge generation layer 160P. The first charge generation layer 160 generates a charge, or injects the charge, i.e., electrons and holes, separately into the first and second light emitting layers 140 and 190.

The third light emitting part ST3 comprising a third light emitting layer 250 is on the second light emitting part ST2. The third light emitting layer 250 may emit light of red, green, or blue: for example, it may be a blue light emitting layer in this exemplary embodiment. The blue light emitting layer comprises one among a blue light emitting layer, a dark blue light emitting layer, and a sky blue light emitting layer. Alternatively, the third light emitting layer 250 may be formed of a blue light emitting layer and a red light emitting layer, of a blue light emitting layer and a yellow-green light emitting layer, or of a blue light emitting layer and a green light emitting layer.

The third light emitting part ST3 further comprises a third hole transport layer 240 on the second light emitting part ST2, and a second electron transport layer 260 and an electron injection layer 210 that are on the third light emitting layer 250. The second electron transport layer 260 has the same composition as the aforementioned first electron transport layer 150, so its description will be omitted. Accordingly, the third light emitting part ST3 comprising the third hole transport layer 240, the third light emitting layer 250, the second electron transport layer 260, and the electron injection layer 210 is formed on the second light emitting part ST2. The electron injection layer 210 may not be included in the elements of the third light emitting part ST3, depending on the structure or characteristics of the organic light emitting display device.

The P-type charge generation layer 230P is between the second light emitting part ST2 and the third light emitting part ST3. The P-type charge generation layer 230P is a PN junction charge generation layer attached to the electron functional layer 200. The P-type charge generation layer 230P generates a charge, or inject the charge, i.e., electrons and holes, separately into the second and third light emitting layers 190 and 250.

The cathode 220 is provided on the third light emitting part ST3 to constitute the organic light emitting display device according to the second exemplary embodiment of the present disclosure.

The above-described compound of this disclosure is included in the second light emitting part ST2 comprising a yellow-green light emitting layer. For the yellow-green light emitting layer, an organic layer with high electron mobility to a phosphorescent light emitting layer is required. The compound of this disclosure may be suitable as the phosphorescent light emitting layer since it has high electron mobility. Accordingly, if the compound of this disclosure is included in the second light emitting part ST2, the electron mobility of the second light emitting part ST2 becomes higher. Therefore, it is preferable that the compound of this disclosure is in the second light emitting part ST2 which emits yellow-green phosphorescent light.

Alternatively, if the phosphorescent light emitting layer is in the first light emitting part ST1 or third light emitting part ST3, the compound of this disclosure may be in first light emitting part ST1 or third light emitting part ST3.

Organic light emitting displays using the organic light emitting display device according to the second exemplary embodiment of the present disclosure may include top emission displays, bottom emission displays, dual emission displays, and vehicle lighting. The vehicle lighting may include, but are not necessarily limited to, headlights, high beams, taillights, brake lights, and back-up lights. Moreover, organic light emitting displays using the organic light emitting display device according to the second exemplary embodiment of the present disclosure may be applied to mobile devices, monitors, TVs, etc. In addition, organic light emitting displays using the organic light emitting display device according to the second exemplary embodiment of the present disclosure may be applied to displays in which at least two of the first, second, and third light emitting layers emit light of the same color.

A compound of this disclosure comprises a triazine compound as a functional group with high electron mobility to facilitate electron transport, and a terpyridine compound as a functional group that has a short bond length and includes heteroatoms that react with alkali metals, such as lithium (Li), or alkali earth metals, to facilitate electron injection and generation. Accordingly, the compound of this disclosure has the characteristics of an electron transport layer with high electron mobility or electron transport properties and also the characteristics of an N-type charge generation layer that has excellent electron injection and generation properties and high electron mobility because the compound reacts with alkali metals or alkali earth metals. Also, the compound for the electron functional layer according to this disclosure is an aromatic compound, which rarely breaks apart due to the short conjugation, in which a triazine derivative and the terpyridine compound are connected to prevent a decrease in the electron mobility of the compound for the electron functional layer.

Accordingly, forming the electron functional layer by mixing an alkali metal or alkali earth metal with a compound of this disclosure may facilitate the injection, generation, and transport of electrons in the electron functional layer, thereby improving the efficiency and lifetime of the device. Also, the present disclosure may reduce the manufacturing costs of the organic light emitting display device and improve its productivity by forming an electron function layer as the electron transport layer and the N-type charge generation layer.

Hereinafter, synthesis examples of charge functional compounds of the present disclosure will be described in detail. However, the following examples are only for illustration, and the present disclosure is not limited thereto.

Synthesis of Compound 1-1

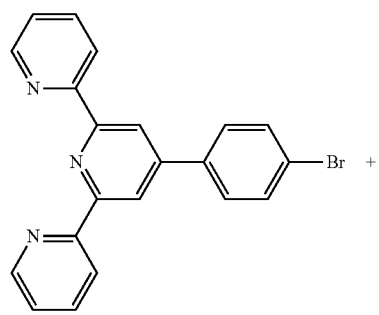

Compound 1-1

2-(4-(4-bromophenyl)-6-(pyridin-2-yl)pyridin-2-yl)pyridine (5.00 g, 12.8 mmol), 2-4-(4,6-diphenyl-1,3,5-triazin-2-yl)phenylboronic acid (3.53 g, 10 mmol), tetrakis triphenylphosphine palladium (0) (Pd(PPh3)4) (0.53 g, 0.46 mmol), a potassium carbonate solution (4M, 10 ml), 30 ml of toluene, and 10 ml of ethanol were put under a nitrogen atmosphere, and then refluxed and stirred for 12 hours. After the reaction, 50 ml of water (H₂O) was added, and the mixture was stirred for 3 hours, then vacuum-filtered, and then subjected to column chromatography using methylene chloride/hexane as the eluent, followed by MC recrystallization, to obtain Compound 1-1 (5.6 g, yield: 90.80%).

Synthesis of Compound 1-2

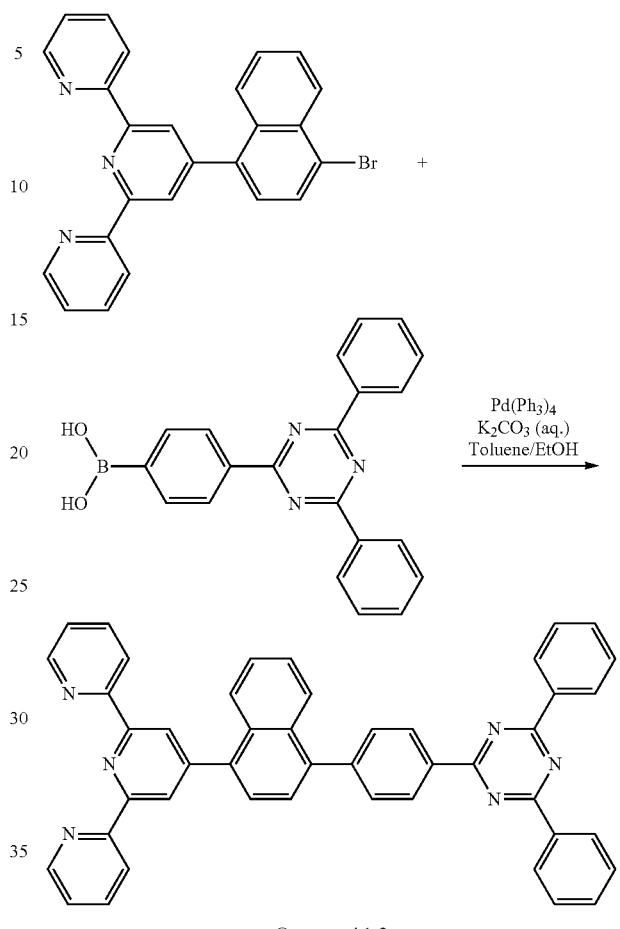

Compound 1-2

2-(4-(1-bromonaphthalen-4-yl)-6-(pyridin-2-yl)pyridin-2-yl)pyridine (5.00 g, 11.4 mmol), 2-4-(4,6-diphenyl-1,3,5-triazin-2-yl)phenylboronic acid (3.53 g, 10 mmol), tetrakis triphenylphosphine palladium (0) (Pd(PPh3)4) (0.53 g, 0.46 mmol), a potassium carbonate solution (4M, 10 ml), 30 ml of toluene, and 10 ml of ethanol were put under a nitrogen atmosphere, and then refluxed and stirred for 12 hours. After the reaction, 50 ml of water (H₂O) was added, and the mixture was stirred for 3 hours, then vacuum-filtered, and then subjected to column chromatography using methylene chloride/hexane as the eluent, followed by MC recrystallization, to obtain Compound 1-2 (5.4 g, yield: 80.98%).

Synthesis of Compound 1-6

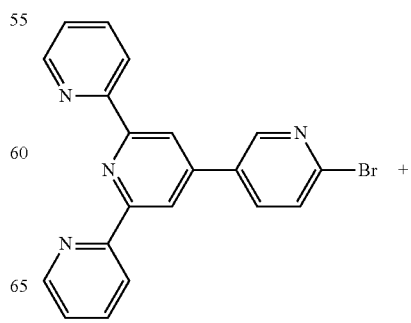

-continued

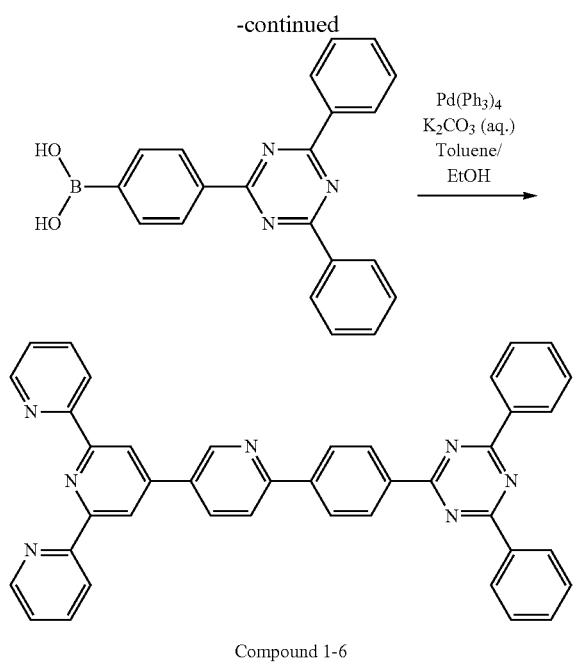

Compound 1-6

2-(4-(6-bromopyridin-3-yl)-6-(pyridin-2-yl)pyridin-2-yl)pyridine) (5.00 g, 12.8 mmol), 2-4-(4,6-diphenyl-1,3,5-triazin-2-yl)phenylboronic acid (3.53 g, 10 mmol), tetrakis triphenylphosphine palladium (0) (Pd(PPh3)4) (0.53 g 0.46 mmol), a potassium carbonate solution (4M, 10 ml), 30 ml of toluene, and 10 ml of ethanol were put under a nitrogen atmosphere, and then refluxed and stirred for 12 hours. After the reaction, 50 ml of water (H$_2$O) was added, and the mixture was stirred for 3 hours, then vacuum-filtered, and then subjected to column chromatography using methylene chloride/hexane as the eluent, followed by MC recrystallization, to obtain Compound 1-6 (4.8 g, yield: 77.70%).

Hereinafter, embodiments for the manufacture of an organic light emitting display device according to the present disclosure will be disclosed. However, the following materials for the electron functional layer do not limit the scope of the present disclosure.

Comparative Example

An organic light emitting display device was manufactured by forming, on a substrate, a first light emitting part comprising a hole injection layer, first hole transport layer, fluorescent blue light emitting layer, and first electron transport layer, a first charge generation layer comprising an N-type charge generation layer and a P-type charge generation layer, a second light emitting part comprising a second hole transport layer, phosphorescent yellow-green light emitting layer, and second electron transport layer, a second charge generation layer comprising an N-type charge generation layer and a P-type charge generation layer, a third light emitting part comprising a third hole transport layer, fluorescent blue light emitting layer, third electron transport layer, and electron injection layer, and a cathode. Here, the second electron transport layer was formed of an anthracene compound, and the N-type charge generation layer was formed of a phenanthroline compound.

Embodiment 1

It has the same elements as the above-described Comparative Example, and an electron functional layer was formed in place of the second electron transport layer and the N-type charge generation layer of the second charge generation layer by co-deposition of Compound 1-1 and lithium (Li).

Embodiment 2

It has the same elements as the above-described Comparative Example, and an electron functional layer was formed in place of the second electron transport layer and the N-type charge generation layer of the second charge generation layer by co-deposition of Compound 1-2 and lithium (Li).

Embodiment 3

It has the same elements as the above-described Comparative Example, and an electron functional layer was formed in place of the second electron transport layer and the N-type charge generation layer of the second charge generation layer by co-deposition of Compound 1-6 and lithium (Li).

The materials for the electron functional layer in the above Comparative Example and Embodiments do not limit the scope of the present disclosure.

The operating voltage, efficiency, chromaticity coordinates, and lifetime of the devices manufactured according to the above-described Comparative Example and Embodiments were measured and shown in the following Table 1. (The devices operated at a current density of 10 mA/cm$^2$, and lifetime T98 is the time it takes for the luminance to decrease to 98% of the initial luminance).

Figure 6:
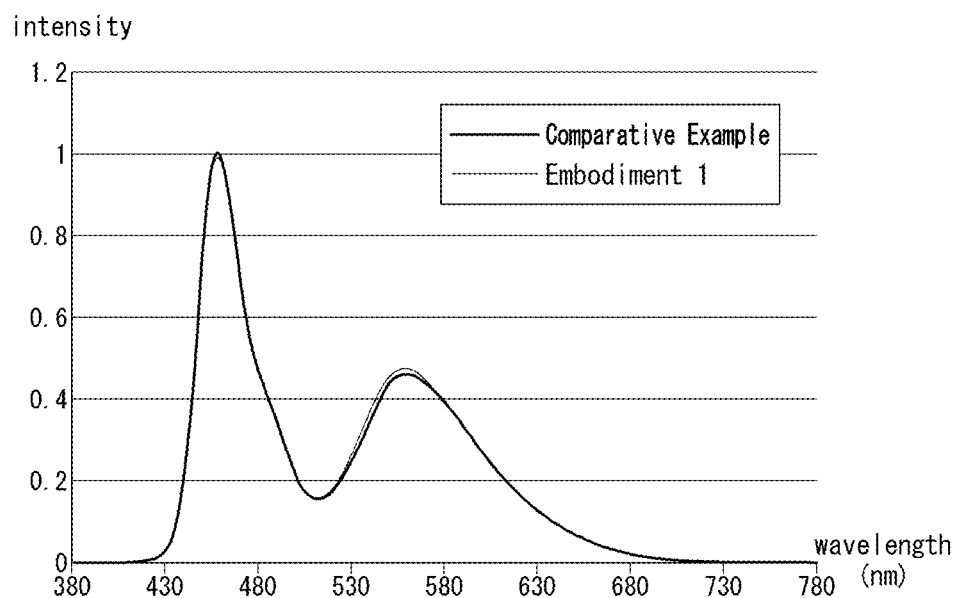
FIG. 6 is a graph showing the light emission spectra of devices manufactured according to Comparative Example and Embodiment 1 according to the present disclosure.
Figure 7:
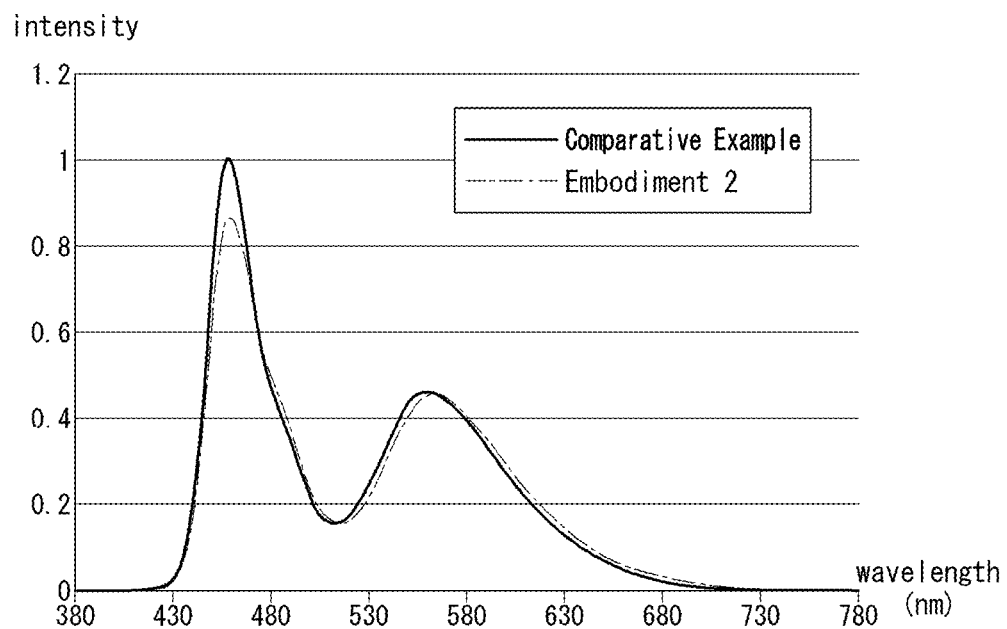
FIG. 7 is a graph showing the light emission spectra of devices manufactured according to Comparative Example and Embodiment 2 according to the present disclosure.
Figure 8:
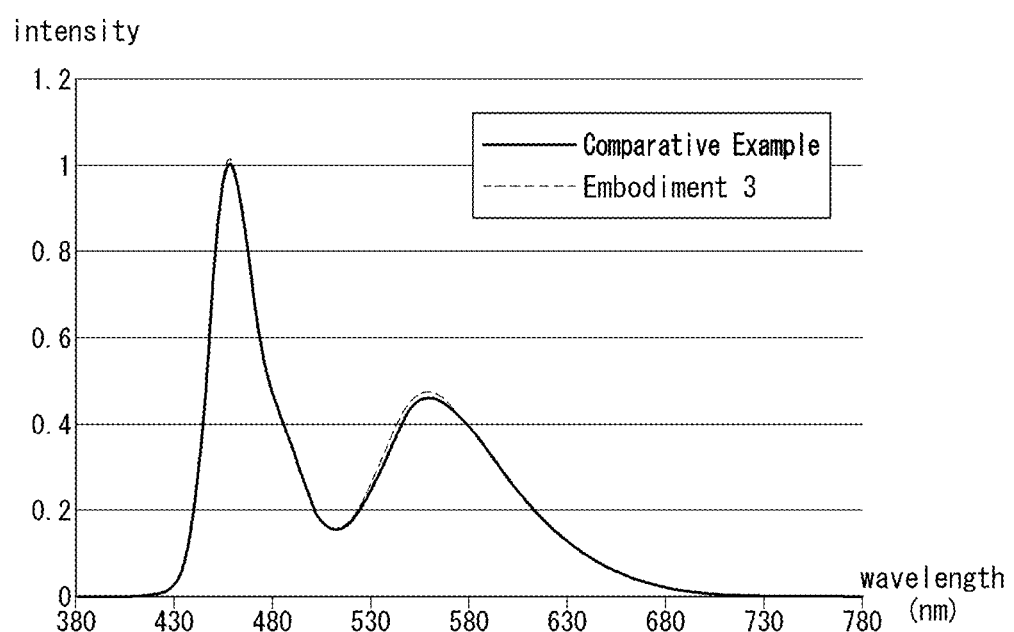
FIG. 8 is a graph showing the light emission spectra of devices manufactured according to Comparative Example and Embodiment 3 according to the present disclosure.

The light emission spectra of the organic light emitting display devices manufactured according to Comparative Example and Embodiment 1 were measured and shown in FIG. 6, the light emission spectra of the organic light emitting display devices manufactured according to Comparative Example and Embodiment 2 were measured and shown in FIG. 7, and the light emission spectra of the organic light emitting display devices manufactured according to Comparative Example and Embodiment 3 were measured and shown in FIG. 8. In FIGS. 6 to 8, the horizontal axis represents wavelength, and the vertical axis represents intensity. Intensity is expressed relative to the peaks of the light emission spectra.

TABLE 1

| | Operating Voltage | Efficiency | Chromaticity coordinates | | Lifetime (@3000 nit) | |
| --- | --- | --- | --- | --- | --- | --- |
| | (V) | (Cd/A) | CIEx | CIEy | T98@blue | T98@white |
| Comparative Example 1 | 11.7 | 72.4 | 0.278 | 0.288 | 459 | 1668 |
| Embodiment 1 | 11.6 | 75.0 | 0.275 | 0.294 | 498 | 1985 |

TABLE 1-continued

| | Operating Voltage | Efficiency | Chromaticity coordinates | | Lifetime (@3000 nit) | |
|---|---|---|---|---|---|---|
| | (V) | (Cd/A) | CIEx | CIEy | T98@blue | T98@white |
| Embodiment 2 | 11.6 | 71.9 | 0.292 | 0.300 | 472 | 1751 |
| Embodiment 3 | 12.2 | 73.7 | 0.277 | 0.290 | 434 | 1589 |

Referring to Table 1, Embodiment 1 using the electron functional layer formed by co-deposition of the Compound 1-1 and lithium (Li) showed a decrease of 0.1 V in operating voltage, an increase of 2.6 Cd/A in efficiency, similar chromaticity coordinate values, an increase of 39 hours in blue lifetime, and an increase of 317 hours in white lifetime, compared to Comparative Example using different materials for the second electron transport layer and N-type charge generation layer. Also, Embodiment 2 using the electron functional layer formed by co-deposition of the Compound 1-2 and lithium (Li) showed a decrease of 0.1 V in operating voltage, an increase of 0.5 Cd/A in efficiency, similar chromaticity coordinate values, an increase of 13 hours in blue lifetime, and an increase of 83 hours in white lifetime. Also, Embodiment 3 using the electron functional layer formed by co-deposition of the Compound 1-6 and lithium (Li) showed an increase of 0.5 V in operating voltage, an increase of 0.7 Cd/A in efficiency, similar chromaticity coordinate values, an increase of 15 hours in blue lifetime, and a decrease of 79 hours in white lifetime.

From these results, it can be found out that the organic light emitting display devices according to the embodiments using an electron functional layer formed by co-deposition of a compound of this disclosure and lithium (Li) showed similar operating voltage levels and similar chromaticity coordinate values and improved efficiency and lifetime, compared to the organic light emitting display device according to the comparative example using different materials for the second electron transport layer and N-type charge generation layer.

Moreover, referring to FIGS. 6 to 8, the light emission spectra of the organic light emitting display devices according to the embodiments of the present disclosure were similar to the light emission spectrum of the organic light emitting display device according to the comparative example. These results demonstrate that the organic light emitting display devices according to the present disclosure have a light emission spectrum similar to that of the comparative example, while using a single electron functional layer in place of the electron transport layer and the N-type charge generation layer.

A compound of this disclosure comprises a triazine compound as a functional group with high electron mobility to facilitate electron transport, and a terpyridine compound as a functional group that has a short bond length and includes heteroatoms that react with alkali metals, such as lithium (Li), or alkali earth metals, to facilitate electron injection and generation. Accordingly, the compound of this disclosure has the characteristics of an electron transport layer with high electron mobility or electron transport properties and also the characteristics of an N-type charge generation layer that has excellent electron injection and generation properties and high electron mobility because the compound reacts with alkali metals or alkali earth metals. Also, the compound for the electron functional layer according to this disclosure is an aromatic compound, which rarely breaks apart due to the short conjugation, in which a triazine derivative and the terpyridine compound are connected to prevent a decrease in the electron mobility of the compound for the electron functional layer.

Accordingly, forming the electron functional layer by mixing an alkali metal or alkali earth metal with a compound of this disclosure may facilitate the injection, generation, and transport of electrons in the electron functional layer, thereby improving the efficiency and lifetime of the device. Also, the present disclosure may reduce the manufacturing costs of the organic light emitting display device and improve its productivity by forming an electron function layer as the electron transport layer and the N-type charge generation layer.

It will be apparent to those skilled in the art that various modifications and variations can be made in the organic light emitting display device of the present invention without departing from the spirit or scope of the invention. Thus, it is intended that the present invention cover the modifications and variations of this invention provided they come within the scope of the appended claims and their equivalents.

What is claimed is:

1. An organic light emitting display device comprising at least two or more light emitting parts between an anode and a cathode and each comprising a light emitting layer,
    at least one of the at least two or more light emitting parts comprising an organic layer,
    wherein the organic layer is formed of a compound represented by the following Chemical Formula 2:

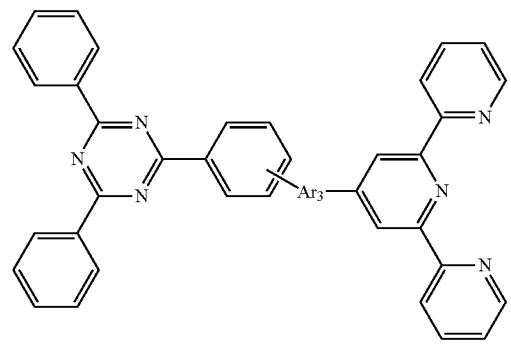

[Chemical Formula 2]

wherein $Ar_3$ is a substituted or unsubstituted aromatic or heteroaromatic compound of 6 to 12 carbon atoms that has a molecular weight of 70 to 150, and
wherein the organic layer comprises an electron transport part comprising the compound and a charge generation part comprising alkali metals or alkaline earth metals and the compound, where the alkali metals or the alkaline earth metals in the charge generation part are uniformly mixed or have a concentration gradient.

2. The organic light emitting display device of claim 1, wherein at least one of the at least two or more light emitting parts comprises a phosphorescent light emitting layer.

3. The organic light emitting display device of claim 1, wherein one of the at least two or more light emitting parts is a blue light emitting part, and the another one of the at least two or more light emitting parts is a yellow-green light emitting part.

4. The organic light emitting display device of claim 3, wherein the organic layer is included in the yellow-green light emitting part.

5. The organic light emitting display device of claim 1, wherein the total thickness of the organic layer is 300 to 500 Å, and the thickness of the electron transport part is 150 to 250 Å.

6. The organic light emitting display device of claim 1, wherein the electron transport part includes a functional group with electron transport properties and the charge generation part includes a functional group that reacts with the alkali metals or the alkaline earth metals.

7. The organic light emitting display device of claim 1, wherein the organic layer has a HOMO level ranging from −5.5 to −6.5 eV and a LUMO level ranging from −2.5 to −3.5 eV.

8. The organic light emitting display device of claim 1, further comprising a P-type charge generation layer between the at least two or more light emitting parts, wherein the organic layer adjoins the P-type charge generation layer.

9. The organic light emitting display device of claim 1, wherein the compound represented by Chemical Formula 2 includes one of the following compounds:

1-1

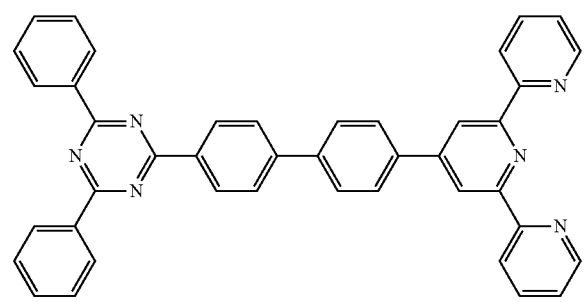

1-2

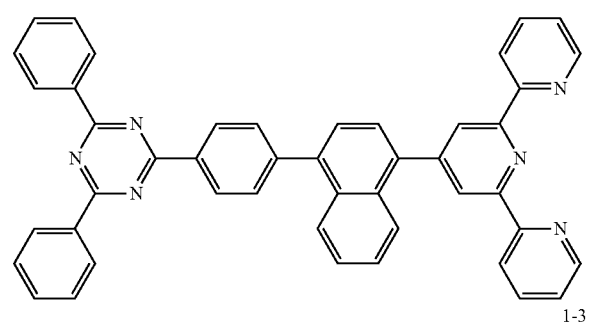

1-3

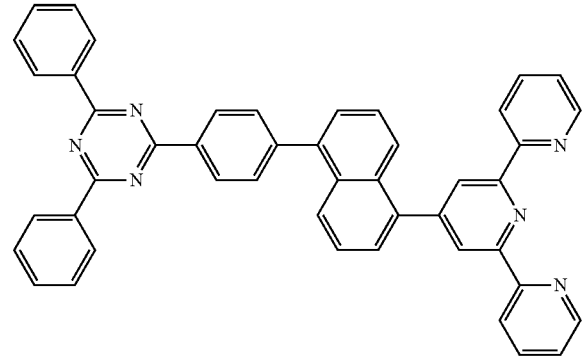

-continued 1-4

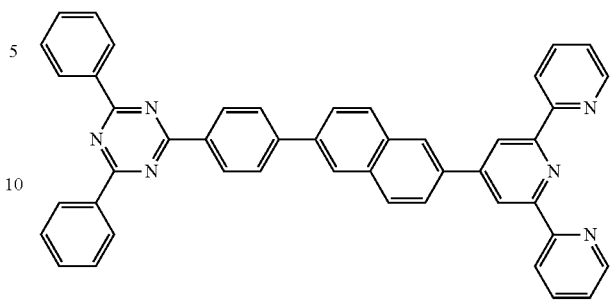

1-5

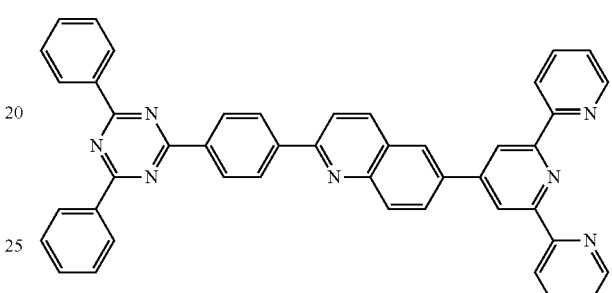

1-6

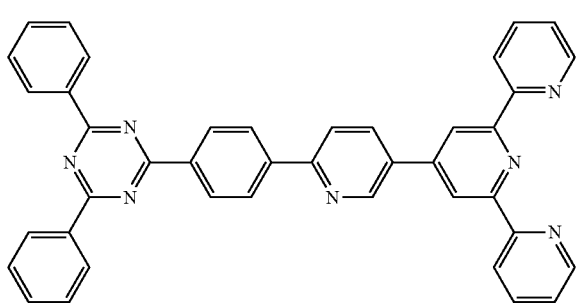

1-7

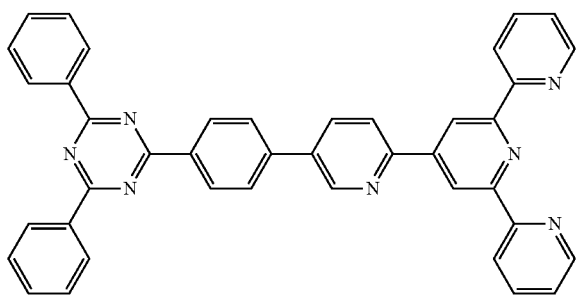

1-8

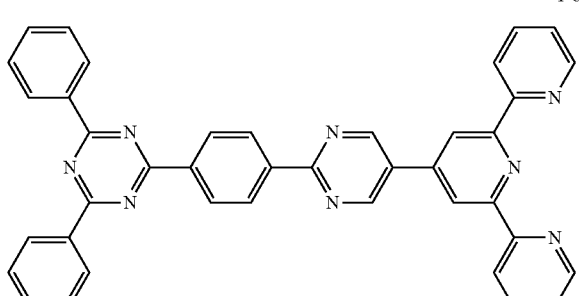

-continued
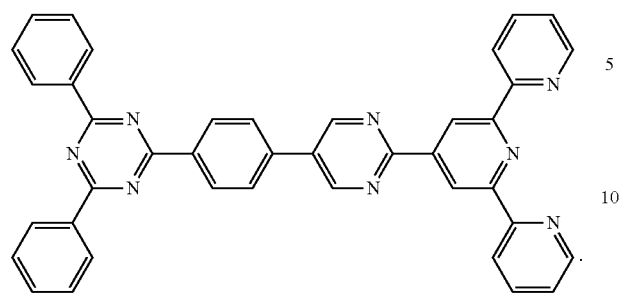
* * * * *